(12) United States Patent
Nicoloau

(10) Patent No.: US 7,166,796 B2
(45) Date of Patent: Jan. 23, 2007

(54) METHOD FOR PRODUCING A DEVICE FOR DIRECT THERMOELECTRIC ENERGY CONVERSION

(76) Inventor: Michael C. Nicoloau, 661 Washington St., Suite 304, Norwood, MA (US) 02062-3529

( * ) Notice: Subject to any disclaimer, the term of this patent is extended or adjusted under 35 U.S.C. 154(b) by 553 days.

(21) Appl. No.: 10/235,230

(22) Filed: Sep. 5, 2002

(65) Prior Publication Data

US 2003/0110892 A1    Jun. 19, 2003

Related U.S. Application Data

(60) Provisional application No. 60/317,692, filed on Sep. 6, 2001.

(51) Int. Cl.
*H01L 35/20* (2006.01)
*H01L 35/14* (2006.01)

(52) U.S. Cl. ............... 136/201; 136/236.1; 136/239; 136/240; 136/242; 257/467; 257/470; 438/48; 438/54

(58) Field of Classification Search ............... 136/201, 136/236.1, 239, 240, 242; 257/467, 470; 438/48, 54
See application file for complete search history.

(56) References Cited

U.S. PATENT DOCUMENTS

| | | | | |
|---|---|---|---|---|
| 3,298,777 | A | * | 1/1967 | Brixner ............... 423/324 |
| 3,782,927 | A | * | 1/1974 | Nicolaou ............. 420/589 |
| 6,225,550 | B1 | * | 5/2001 | Hornbostel et al. ..... 136/236.1 |
| 6,525,260 | B2 | * | 2/2003 | Yamashita et al. ..... 136/239 |

FOREIGN PATENT DOCUMENTS

JP    2002-285274 A  * 10/2002

OTHER PUBLICATIONS

Kajikawa et al, "Thermoelectric properties of sintered magnesium compounds," 15th International Conference on Thermoelectrics, pp. 128-132 (1996).*

Kajikawa et al, "Thermoelectric figure of merit impurity doped and hot-pressed magnesium silicide elements," 17th International Conference on Thermoelectrics, pp. 362-369 (1998).*

* cited by examiner

*Primary Examiner*—Alan Diamond
(74) *Attorney, Agent, or Firm*—Gauthier & Connors LLP

(57) ABSTRACT

In devices used for the direct conversion of heat into electricity, or vice versa, known in the art as thermoelectric power generators, thermoelectric refrigerators and thermoelectric heat pumps, the efficiency of energy conversion and/or coefficient of performance have been considerably lower than those of conventional reciprocating or rotary, heat engines and/or vapor-compression systems, employing certain refrigerants. The energy conversion efficiency of power generating devices, for example, aside from the hot and cold junction temperatures, also depends on a parameter known in the art as the thermoelectric figure of merit $Z=S^2\sigma/k$, where S is the thermoelectric power, $\sigma$ is the electrical conductivity and k is the thermal conductivity, of the material that constitutes the p-type, and/or n-type, thermoelements, or branches, of the said devices. In order to achieve a considerable increase in the energy conversion efficiency, a thermoelectric figure of merit of the order of $10^{-2}$ $K^{-1}$, or more, is needed. It is reasonably expected that such an order of magnitude, for the figure of merit, can be realized with a composition of matter, comprising magnesium, silicon, lead and barium, and optionally comprising one, or more, additional doping materials.

19 Claims, 2 Drawing Sheets

BASIC COMPONENTS OF A DEVICE FOR DIRECT THERMOELECTRIC ENERGY CONVERSION

PERIODIC TABLE OF THE ELEMENTS

FIG. 2

METHOD FOR PRODUCING A DEVICE FOR DIRECT THERMOELECTRIC ENERGY CONVERSION

This application claims the benefit of provisional application 60/317,692 filed Sep. 6, 2001.

BACKGROUND OF THE INVENTION

1. Field of the Invention

The invention is directed to a process for producing a device for direct thermoelectric energy conversion whereby the efficiency of energy conversion from heat to electricity, or vice versa, is substantially increased and is directed to a composition of matter to be used in the manufacture of devices for direct thermoelectric energy conversion.

2. Description of the Prior Art

Using the powder metallurgy technique as a way of producing the composition of matter, as defined above, careful attention must be paid to a recent development that took place at the National Institute of Standards and Technology-NIST. The new technology development program, or invention, titled: "Synthesis of Fine-Powder Polycrystalline Bi—Se—Te, Bi—Sb—Te, and Bi—Sb—Se—Te Alloys for Thermoelectric Applications" was reported by J. Terry Lynch in the June 1996 issue of the International Thermoelectric Society: "Thermoelectric News". Precursors to alloys having the general compositions of matter: Bi—Se—Te, Bi—Sb—Te and Bi—Sb—Se—Te are synthesized by aqueous co-precipitation and metal-organo complex methods. Hydrogen reduction of the precursors produced the alloys in fine-powder, polycrystalline form. The method is simpler than conventional melt-processing and produced an 88–92% yield in laboratory-scale tests. The new method reduces equipment, materials and labor costs, by producing fine powders directly, thus eliminating the crushing and sieving steps necessary after melt-processing. Precursor synthesis occurs at under 100 Celsius in aqueous solution from commonly available chemicals. Alloy synthesis at 300–400 Celsius, lower than melt-processing temperatures, yields more than 88% product compared with theory. Scale-up to continuous production is possible using common chemical flow reactor technology. This new development or invention improves the efficiency and cost-effectiveness of producing solid-state thermoelectric cooling and refrigerating devices. Therefore, it is very likely worthwhile to investigate this new development still further, with the objective of adapting or extending it to the compositions of matter, which constitute the basic embodiments of the present invention. This would substantially eliminate one basic drawback of the powder-metallurgy technique, specifically unwanted contamination, or doping, of the composition of matter, namely with iron, Fe, coming from the steel grinding balls and the steel vessels of the planetary ball mill. That is because a planetary ball mill will not be used, since crushing and pulverization of the composition of matter, or alloy, will no longer be needed. Furthermore, this new technique developed at NIST, if successfully adapted to the compositions of matter, herein specified and claimed, will also help overcome or eliminate the main disadvantages associated with the melt metallurgical techniques previously described. These are the need to agitate or vibrate the constituents during melting, in order to assure the production of a homogeneous alloy, as well as the requirement of maintaining the molten ingredients in an atmosphere of argon or helium, while subjecting them to a relative pressure of between 2 and 30 physical atmospheres, in order to suppress the loss of magnesium, and thus ensure obtaining a stoichiometric alloy.

Thermoelectricity, or thermoelectrics, as it is nowadays called, owes its existence to the discovery by Thomas Johann Seebeck of the first thermoelectric effect, in 1821, ever since known as the Seebeck effect, or Seebeck coefficient. In 1833, Peltier discovered the second thermoelectric effect, ever since known as the Peltier effect. Seebeck discovered that a compass needle would be deflected, when placed near a closed loop, made of two dissimilar metals, when one of the two junctions was kept at a higher temperature than the other. This establishes the fact that a voltage difference exists or is generated, whenever there is a temperature difference between the two junctions. That would also depend on the nature of the metals involved. Peltier found that temperature changes occur, accompanied by the absorption or rejection of heat, at a junction of dissimilar metals, whenever an electrical current is caused to flow through the junction. In 1838, Lenz came forth with the explanation that heat is either absorbed or released at a junction depending on the direction of current flow. Furthermore, Sir William Thomson, later known as Lord Kelvin, who, along with German physicist Rudolf Julius Emmanuel Clausius, became famous around the middle of the nineteenth century for their formulation of the first and second laws of thermodynamics, as well as for their discovery and establishment of the concept of entropy, also made important contributions to thermoelectricity. He discovered a third thermoelectric effect: The Thomson effect, which relates to the heating or cooling of a single homogeneous conductor subjected to a temperature gradient. He also established four important equations, correlating all three effects, namely the Seebeck, Peltier and Thomson coefficients. These are known in the art as the Kelvin relations and are found in any standard textbook on thermoelectricity, or direct energy conversion. Thermoelectricity, moreover, received a major boost in 1885, when Lord Rayleigh considered or suggested using the Seebeck effect for the generation of electricity. A milestone in our general understanding of thermoelectricity, specifically, how to best use and apply it for the direct conversion of heat into electricity, or vice versa, was brought about in 1911 by Altenkirch. He created a satisfactory theory of thermoelectricity for power generation and cooling. He reasoned that, for best performance, the Seebeck coefficient, or thermoelectric power, as it is currently called, must be as high as possible, likewise the electrical conductivity must be as high as possible, while the thermal conductivity should be as low as possible. Thus, we have the power factor: $PF = S^2 \sigma = S^2/\rho$, where S=Seebeck coefficient or thermoelectric power, $\sigma$=electrical conductivity and $\rho$=electrical resistivity, which quantity, that is the power factor, must be increased as much as possible, or maximized, and k=thermal conductivity, which must be decreased as much as possible, or minimized. Thus, Altenkirch was led to establishing the following equation:

$$Z = \frac{S^2 \sigma}{k} = \frac{S^2}{\rho k} = \frac{PF}{k}$$

where Z is known as the thermoelectric figure of merit, and has the dimensions of $K^{-1}$. This equation can be rendered dimensionless, by multiplying it by some absolute temperature, T, which could be that of the hot junction of the thermoelectric device. This gives rise to another quantity:

The dimensionless thermoelectric figure of merit, ZT, which, like, Z can also be used in the evaluation of the performance, and energy conversion efficiency, of any thermoelectric material or device.

The modern period in thermoelectrics actually started when the attention of engineers and scientists focused more and more on semiconductors. The latter are defined as those substances or materials whose electrical conductivity is intermediate between that of metals and that of insulators. Comparison was being made of so-called minerals, which is the way semiconductors were known, or called, at that time, versus metals. It was found that metals had the advantage of malleability, relatively constant properties, i.e. practically independent of temperature, as well as chemical stability, whereas minerals or semiconductors, when moderately, or even heavily, doped, possessed a relatively high Seebeck coefficient, S, and consequently a moderate thermoelectric figure of merit, Z. Disadvantages of metals were found to be their low Seebeck coefficient, S, their low thermoelectric figure of merit, Z, and the limit imposed by the Wiedemann-Franz law on the ratio between thermal conductivity, which is mainly electronic, and electrical conductivity. This law specifies that such a ratio, when plotted versus the absolute temperature, T, represents a straight line, or linear relationship, for metals, whose slope is the Lorenz number, L. So the Wiedemann-Franz law for metals may be expressed as follows:

$$\frac{k}{\sigma} = \frac{k_{el}}{\sigma} = LT$$

where $k_{el}$=electronic thermal conductivity.

For metals $k=k_{el}$=total thermal conductivity, since the lattice thermal conductivity is insignificant, or negligible.

Disadvantages of minerals, or semiconductors, were their brittleness, temperature dependent properties and lack of chemical stability. As a matter of fact, the dependency of the properties of semiconductors on temperature makes all theoretical analyses in respect of their performance, figure of merit, energy conversion efficiency, coefficient of performance, power generated, or consumed, heat absorbed or rejected at the cold junction, heat rejected, absorbed or transferred at the hot junction, when used as thermoelectric materials, or thermoelements, much more complicated than those for metals. Thus, metals were found to be more useful as thermocouple wires, whereas semiconductors were deemed more appropriate for the manufacture of small modules, constituting the basic thermoelements, legs or branches of thermoelectric devices. It should be emphasized that many of the technological difficulties encountered in thermoelectricity emanate from the fact that thermoelectric devices comprise modules, or thermoelements, made of semiconductors, which generally do not posses the flexibility, resilience and chemical stability of metals.

Further progress in thermoelectricity was made in the 1930s, when synthetic or compound semiconductors were studied for the first time. In 1947, Maria Telkes developed and constructed a thermoelectric power generator with a 5% energy conversion efficiency. Moreover, in 1949, A. F. Ioffe established the theory of semiconductor thermoelectricity. He wrote the two pioneering books: "Physics of Semiconductors," and "Semiconductor Thermoelements and Thermoelectric Cooling." Semiconductors are actually substances or materials having an electrical conductivity that is intermediate between that of metals and that of insulators. An increase in the electrical conductivity of semiconductors can normally be achieved by increasing the number of free charge carriers therein. This can be done by introducing the atoms of a suitable foreign element, compound or material, generally known as the doping agent, or impurity, in an appropriate amount, or proportion, into the semiconductor. The latter process of incorporating the atoms of a foreign element or impurity into a semiconductor is called doping. Thus, doping is carried out in such a way as to bring about a free charge carrier concentration in the semiconductor of between $1\times10^{18}$ and $5\times10^{20}$ carriers per cubic centimeter at room temperature. Doped semiconductors with a free charge carrier concentration of the order of $10^{18}$ carriers per $cm^3$ are considered "lightly doped", those with a free charge carrier concentration of the order of $10^{19}$ carriers per $cm^3$ are considered "moderately doped", while those with a free charge carrier concentration of the order of $10^{20}$ carriers per $cm^3$ are known as "heavily doped" semiconductors. It should be noted here that the power factor, or $S^2\sigma$, is maximized at a free charge carrier concentration of about $10^{19}$ carriers per $cm^3$. Likewise, the thermoelectric figure of merit, Z, is also maximized at about the same free charge carrier concentration of $10^{19}$ carriers per $cm^3$. These are approximate rules of thumb that are applicable to all semiconductors in general, but may vary slightly from one semiconductor to another.

Most semiconductors are non-elemental, or synthetic, i.e. compounds, and generally have low to moderate energy band gaps. Most earlier semiconductors involved elements of higher atomic number and atomic mass. This was done intentionally, in order to select elements having a thermal conductivity as low as possible, thus optimizing the thermoelectric figure of merit. Consequently, the applicable rule here is that the higher the atomic number, and atomic mass, of an element is, the lower is its thermal conductivity. This has undoubtedly led to the: "heavy element selection criterion." Thus an element with a high atomic mass, i.e. a heavy element, ought to be selected and given preference over other lighter elements, since it was a foregone conclusion that such an element would have the lowest possible thermal conductivity. Consequently, this would be conducive to the highest possible thermoelectric figure of merit. This type of reasoning was very prominent and proved fruitful in the thirties, forties and fifties, and was spearheaded beyond any shadow of a doubt, by A. F. Ioffe himself. It certainly initiated the research and development work that led to the establishment, to this very day, of bismuth telluride, $Bi_2Te_3$, and lead telluride, PbTe, as the two most prominent, and most frequently used, thermoelectric materials. The former has been widely used, ever since, in thermoelectric refrigeration, or cooling, while the latter has been successfully employed in both thermoelectric cooling and thermoelectric power generation. However, this notion, or concept, that the thermal conductivity of an element is lower, the higher its atomic mass or atomic number, is not necessarily true all over the Periodic Table. It is thus only partly valid. Its validity becomes more noticeable and accentuated, starting with the column representing group IVB elements, as we move downwards to lower and lower rows, and likewise as we move to the right, to group VB and VIB elements. Thus, despite its earlier successes in the thirties, forties and fifties, in the selection of good thermoelectric elements and compounds, the heavy element selection criterion or concept does not universally hold regarding all elements of the Periodic Table. Moreover, this earlier observation, concept or criterion, aside from helping identify and develop two of the best materials, thus far, in the field of thermoelectricity, it simultaneously also helped identify, or discover, a total of five, mainly heavy, elements, namely: lead, bismuth, antimony, tellurium and selenium. All these five elements, also having low thermal conductivities, were the major contributors to the successes achieved in thermoelectrics in the thirties, forties and fifties, namely in thermoelectric cooling, and thermoelectric power generation. Thus, more synthetic, or compound, semiconductors came into being, or were eventually developed, as a result of the aforementioned criterion. Examples are, just to name only a few: lead selenide, lead antimonide, lead telluride selenide, lead antimonide selenide, bismuth antimonide, bismuth selenide, antimony telluride, silver antimony telluride, bismuth telluride selenide and bismuth antimonide selenide.

Summarizing, since the electrical conductivity of a semiconductor has to be generally increased, in order to maximize the thermoelectric power factor: PF=$S^2\sigma$=$S^2/\rho$, then semiconductors are normally either moderately, or heavily, doped. Furthermore, in order to, likewise, maximize the thermoelectric figure of merit:

$$Z = \frac{PF}{k} = \frac{S^2\sigma}{k} = \frac{S^2}{\rho k}$$

the thermal conductivity must also be reduced, or lowered, as much as possible. In order to achieve this, one must apply, and make full use of, the "A. F. Ioffe Heavy Element Selection Criterion," referred to earlier in this specification, by reviewing the Periodic Table of the Elements and considering the possibility of using the five elements, occupying the seventh or bottom row, and simultaneously belonging to Groups IVB, VB, VIB, VIIB and VIII of the Periodic Table, for that purpose. These five elements possess the highest five atomic numbers possible in the Periodic Table, namely, 100, 101, 102, 103 and 104, and the corresponding atomic masses are 257, 258, 259, 262 and 261, respectively. The corresponding names of these elements, likewise, are Fermium, Fm, Mendelevium, Md, Nobelium, No, Lawrencium, Lr, and Dubnium, Unq, respectively. These are the names recommended by the International Union of Pure and Applied Chemistry, IUPAC, and modified as suggested by the Berkeley (USA) researchers. The aforementioned five elements, having the highest atomic numbers and atomic masses in the Periodic Table, unfortunately, are not good for our purpose, that is for thermoelectric energy conversion. They are all metallic, synthetic, radioactive and short-lived, and must therefore be discarded. One must thus shift one's attention to the five elements lying immediately above the aforementioned ones, namely above Fm, Md, No, Lr and Unq, in the $6^{th}$ row. Accordingly, one finds or identifies five new elements, to choose the prospective best, or ideal, thermoelectric semiconducting material from. These are lead, bismuth, polonium, astatine and radon. Radon, Rn, is a heavy gaseous radioactive element and hence must be ruled out. Astatine, At, is a highly unstable radioactive element and must also be excluded. Polonium, Po, is a naturally radioactive metallic element and must likewise be eliminated as a possible choice. That leaves only bismuth, Bi, and lead, Pb, with atomic numbers of 83 and 82, and atomic masses of 208.98 and 207.2, respectively, as our ideal semiconducting thermoelectric elements, or materials. It should have become evident to any physicist working on thermoelectrics at that time, either theoretically, or experimentally, or both, and this very probably refers to A. F. Ioffe himself, that further alloying, or reacting, of either bismuth or lead, with tellurium, which is a non-metallic semiconducting element, would produce compounds that are definitely semiconductors. Moreover, reacting or alloying each of bismuth and lead with tellurium, yielding the compounds bismuth telluride, $Bi_2Te_3$, and lead telluride, PbTe, respectively, would further reduce the thermal conductivity of the resulting compounds and bring it to some intermediate value between those of the original ingredients. Thus, alloying bismuth with tellurium, reduces the thermal conductivity of the former to some intermediate value in between that of bismuth and that of tellurium. Although lead, unlike bismuth, behaves more as a metal, rather than as a semiconductor, which must have made it relatively more difficult to be identified, or thought of, initially, as a potential thermoelectric material, yet alloying or reacting it again with tellurium has brought about another outstanding synthetic, or compound, semiconductor, with singular or unique thermoelectric properties, and that is lead telluride, PbTe. While bismuth telluride is more well known for its widespread or prevalent use in thermoelectric refrigeration, lead telluride, despite fierce competition from the silicon-germanium alloys, namely $Si_{0.7}Ge_{0.3}$, is, to this very day, one of the best materials for thermoelectric power generation. The two synthetic materials, or compound semiconductors, i.e. $Bi_2Te_3$ and PbTe, were thus beyond any shadow of a doubt responsible for the big successes and triumphs of thermoelectricity, before the advent of the sixties. In conclusion, the first thermoelectric refrigerator, or heat pump, was built in 1953, while the first thermoelectric power generator with a 5% efficiency was constructed in 1947, by Maria Telkes.

Most semiconductors have low to moderate energy band gaps. The energy band gap is the single most important factor to be considered in the development, design or synthesis of any new semiconducting material, as to its possible or potential use for direct thermoelectric energy conversion. The width of the forbidden energy band gap is crucial for thermoelectric materials, because the width of the gap is a measure of the energy required to remove an electron from a localized bond orbital and raise the electron to a conducting level. A material with a narrow energy band gap is undesirable, because this implies that the material will become degenerate or intrinsic at a relatively low temperature. According to a formula given by Pierre Aigrain, the narrower the energy band gap of a material is, the lower the temperature at which the material becomes intrinsic, or degenerate, and thus useless for thermoelectric energy conversion. The reason for the foregoing is that when a material becomes degenerate, both its electrical and thermal conductivities increase, however, its thermoelectric power, which is raised to the power 2, also decreases quite substantially, and this has a detrimental effect on the figure of merit. Again, from Aigrain's formula, it can be inferred that the wider the energy band gap of a material is, the higher will be the maximum hot junction temperature at which a device, comprising such a material, can be operated, while maintaining a high thermoelectric figure of merit. A device in which both the maximum hot junction temperature, and the thermoelectric figure of merit, are adequately high, will also have a high overall energy conversion efficiency.

On the other hand, a very wide energy band gap is still undesirable, because it implies a greater difficulty of removal of electrons form localized bond orbitals to conduction bands. Consequently, a moderately wide energy band gap, namely about 0.6 electron volt, is adequate for direct thermoelectric energy conversion. This figure was suggested by Pierre Aigrain, as one of the characteristics of good thermoelectric materials. The following table shows the energy band gaps of various semiconducting intermetallic compounds, or synthetic semiconductors, and relevant semiconducting and metallic elements.

| Compound or Element | Energy Band Gap eV | Compound or Element | Energy Band Gap eV | Compound or Element | Energy Band Gap eV |
|---|---|---|---|---|---|
| Ca$_2$Si | 1.9 | PbS | 0.37 | α-LaSi$_2$ | 0.19 |
| Ca$_2$Sn | 0.9 | InSb | 0.27 | OsSi$_2$ | 1.4 |
| Ca$_2$Pb | 0.46 | InAs | 0.47 | Os$_2$Si$_3$ | 2.3 |
| Mg$_2$Si | 0.78 | AlSb | 1.6 | Ru$_2$Ge$_3$ | 0.34 |
| Mg$_2$Ge | 0.70 | GaSb | 0.8 | | |
| Mg$_2$Sn | 0.36 | ReSi$_2$ | 0.12 | | |
| Mg$_2$Pb | 0.10 | FeSi$_2$ | 0.9 | | |
| BaSi$_2$ | 0.48 | Ru$_2$Si$_3$ | 0.9 | | |
| MnSi$_{1.73}$ | 0.67 | Si | 1.1 | | |
| CrSi$_2$ | 0.35 | Ge | 0.60 | | |
| Si$_x$Ge$_{1-x}$ | 0.7 | Sn | 0.10 | | |

To recapitulate, most semiconductors, particularly those used in thermoelectric applications, normally have low to moderate energy band gaps, and are selected or produced, so as to have high atomic masses, in order to lower the thermal conductivity. Many semiconductors are either soft or brittle, have covalent chemical bonds, are somewhat chemically unstable, or reactive with atmospheric oxygen and moisture, and have low to moderate melting points.

In 1956, A. F. Ioffe conceived of the idea of alloying, or forming solid solutions of, isomorphic semiconducting compounds, in order to lower the thermal conductivity of thermoelectric materials. The foregoing is due to phonon-phonon interaction, and the resulting phonon-phonon scattering, the rate of which increases with increasing temperature, simply because there are more phonons around. In the quantum mechanical picture of phonons, this type of phonon-phonon scattering is described as the absorption, or emission, of one phonon by another phonon. Thus, in phonon-phonon interaction, the incident or incoming phonon increases in energy due to its interaction with the obstacle, and the absorption of one phonon. Phonon emission is similar except that the incident or incoming phonon loses energy, and the obstacle is represented by an emitted phonon.

The next most important source of scattering for phonons is due to point defects. A point defect simply means that one of the atoms making up the crystal is different from all of the others. A point defect is, by definition, very small, and has little or no effect on long wavelength or low energy phonons. But short wavelength, high energy, phonons are strongly scattered by point defects. Any type of defect will scatter phonons, but the most important type of point defect in thermoelectric materials is usually an atom with a mass very different from that of the host.

When the main difference between the point defect and the host is the mass of the atom, the scattering is often called "alloy scattering," "mass fluctuation scattering," or "mass fluctuation alloy scattering." By the same token, when the main difference between the point defect and the host is the volume of the atom, the scattering is called "volume fluctuation scattering," or "volume fluctuation alloy scattering." Normally, the main difference between the point defect and the host involves both the mass and volume of the atom. Thus, both mass fluctuation scattering, and volume fluctuation scattering, usually take place simultaneously. Consequently, the term "alloy scattering" generically implies point defect phonon-phonon scattering, due to both mass and volume fluctuations, or differences, between the point defects and the host atoms. The terms: "mass and volume fluctuation scattering" or "alloy scattering" are generally preferred over the term; "point defect scattering," when the point defect atoms are present in quite substantial proportions in the mixture, or alloy, composed of both the defect and host atoms. But the idea, or principle, remains the same: if the crystal lattice is really uniform, phonons travel with very little scattering. Whereas, when the lattice has lots of defects, phonons are strongly scattered.

SUMMARY OF THE INVENTION

According to one embodiment of this invention, a process for producing a device for direct thermoelectric energy conversion, consisting of a p-type branch, an n-type branch, a hot junction and a cold junction, comprises the use of a composition of matter in the manufacture of the n-type branch and/or p-type branch of the device, wherein the composition of matter contains magnesium, silicon, lead and barium, and optionally contains one or more additional doping materials. The composition of matter may still contain no additional doping material, or materials.

The four basic constituents of the composition of matter, namely Mg, Si, Pb and Ba, are mixed together to react chemically with each other to form compounds. Thus, according to another embodiment of this invention, a process for producing a device for direct thermoelectric energy conversion, consisting of a p-type branch, an n-type branch, a hot junction and a cold junction, comprises using a composition of matter in the manufacture of the n-type branch and/or p-type branch of the device, wherein the composition of matter comprises magnesium silicide Mg$_2$Si, wherein part of magnesium is replaced by barium, and part of silicon is replaced by lead. The composition thus is an alloy, or solid solution, of intermetallic compounds, containing magnesium silicide, magnesium plumbide, barium silicide and barium plumbide, wherein the composition of matter has the following constitutional formula:

$$Ba_{2r}Mg_{2(1-r)}Si_{1-x}Pb_x$$

wherein r, (1−r), (1−x) and x represent the atomic proportion of each of barium, magnesium, silicon and lead in the alloy, respectively, and wherein the composition of matter optionally contains one, or more, additional doping materials. The composition may still contain no additional doping material, or materials.

According to another embodiment of this invention, the n-type and p-type branches of the device for direct thermoelectric energy conversion are manufactured according to the thin film technology, wherein the thickness or length of the branches is substantially downsized, which is conducive to a substantial reduction in the overall dimensions, as well as an increase in the energy conversion efficiency of the device.

According to another embodiment of this invention, the n-type and p-type thermoelements, or branches, are encapsulated inside, covered, or surrounded, by, a very thin layer of a material that is a very bad conductor of both heat and electricity, wherein the thin layer, or capsule, makes no contact with the hot and cold junctions, makes very little contact with the lateral surface of each thermoelement, and extends over the entire length thereof, wherein the contact or contacts are very close to the hot and cold junctions, wherein the capsule is of circular, quasi-square, or rectangular, cross-section, wherein the material does not instantly, and in the long run, interact chemically, or by diffusion, with the composition of matter, which the branches are composed of, and wherein the capsule material has a very high chemical and mechanical stability, and is very resistant to acids, corrosion and high temperatures.

According to another embodiment of this invention, the thin film technology, the integrated circuit technology and the encapsulation technique are all combined together in the manufacture and assembly of devices for direct thermoelectric energy conversion comprising the composition of matter.

BRIEF DESCRIPTION OF THE DRAWINGS

Figure 2:
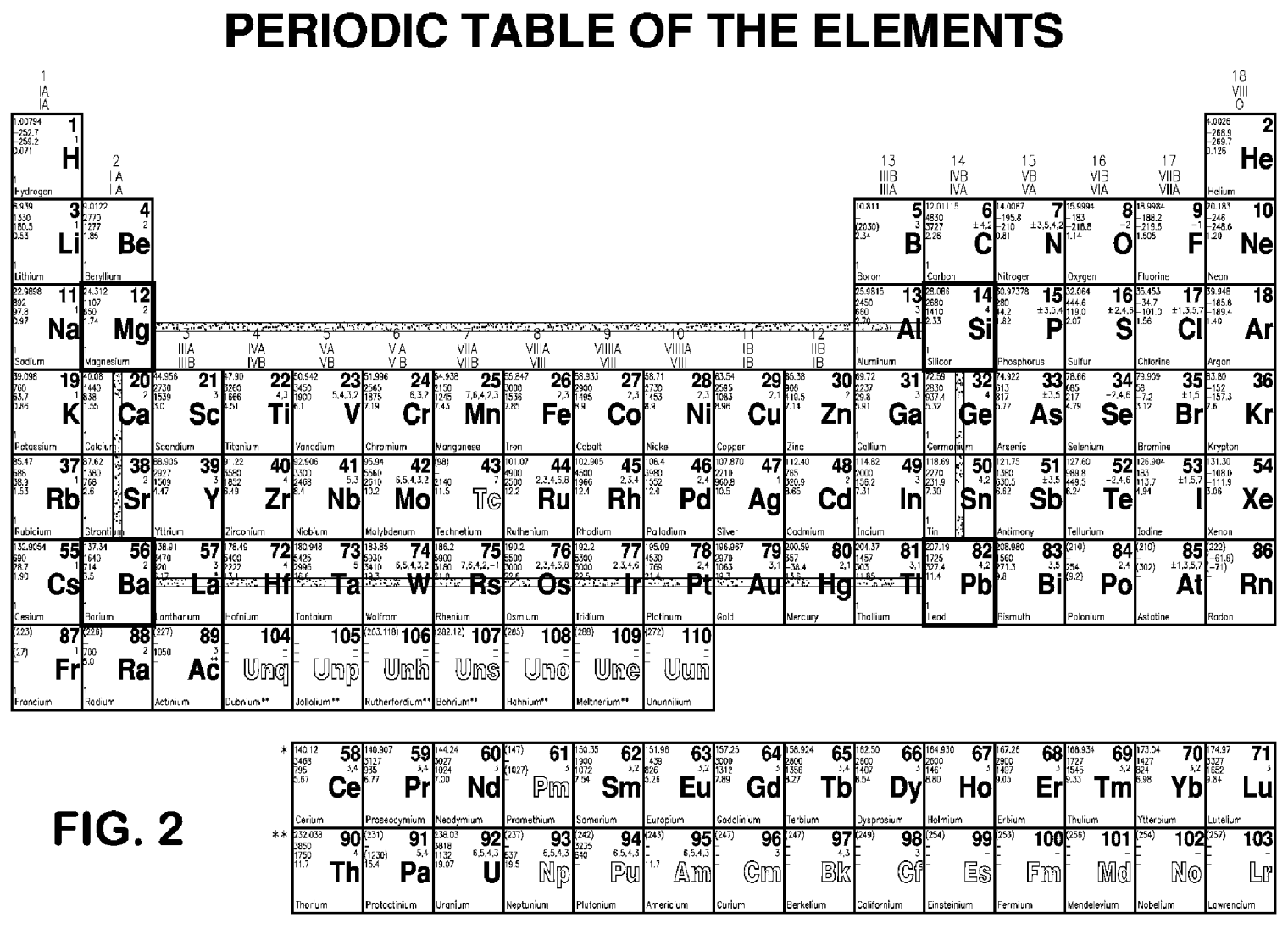

FIG. 2 is a periodic table highlighting the basic concept of the present invention.

DETAILED DESCRIPTION OF PREFERRED EMBODIMENT

Figure 1:
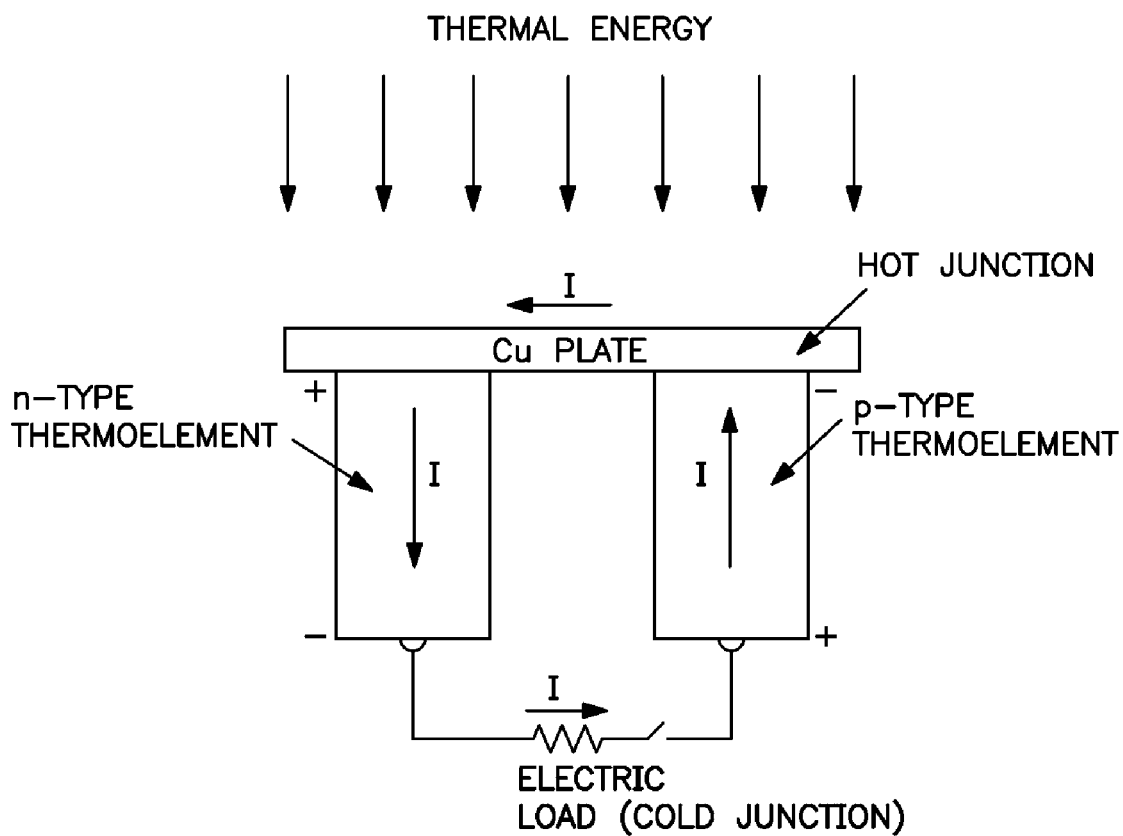
FIG. 1 is a flow chart embodying the basic components of a device for direct thermoelectric energy conversion.

This invention relates to a process, or method, for producing a device for direct thermoelectric energy conversion, whereby the efficiency of energy conversion from heat to electricity, or vice versa, is substantially increased, as indicated in FIG. 1. The sources of thermal energy include solar radiation, nuclear element or cell, combustion of fossil fuels, waste heat from a boiler, gas turbine or automobile exhaust gases and biological waste, or biomass.

The invention also relates to compositions of matter, to be used in the manufacture of devices for direct thermoelectric energy conversion.

The invention relates to a device for effecting a direct conversion of thermal energy to electrical energy, or vice versa.

The invention relates to a method for preparing compositions of matter for direct thermoelectric energy conversion.

According to one embodiment or aspect of this invention, a process for producing a device for direct thermoelectric energy conversion, consisting of a p-type branch or thermoelement, an n-type branch or thermoelement, a hot junction and a cold junction, comprises the use of a composition of matter in the manufacture of the n-type branch and/or p-type branch of the device, wherein the composition of matter comprises magnesium silicide, $Mg_2Si$, wherein part of magnesium is replaced by barium, and part of silicon is replaced by lead, wherein the composition of matter thus is an alloy, or solid solution, of intermetallic compounds, containing magnesium silicide, magnesium plumbide, barium silicide and barium plumbide, wherein the composition of matter has the following constitutional formula:

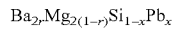

$$Ba_{2r}Mg_{2(1-r)}Si_{1-x}Pb_x$$

wherein r, (1−r), (1−x) and x represent the atomic proportion of each of barium, magnesium, silicon and lead in the alloy, respectively, and wherein the composition of matter optionally contains one, or more, additional doping materials.

With careful adjustment of the r and x parameters, in the constitutional formula, it is possible to obtain compositions having an extremely low thermal conductivity, the minimum value of which should approximately be 0.002 $Wcm^{-1}K^{-1}$. The atomic, or molecular, proportion of the doping agent, or impurity, as well as the concentration of the free charge carriers in the composition of matter should, preferably, be in the ranges from $10^{-8}$ to $10^{-1}$, and $1 \times 10^{15}$ to $5 \times 10^{20}$ carriers $cm^{-3}$, respectively. By carefully controlling both the doping level, as well as the concentration of the free charge carriers, it is possible to maximize the thermoelectric power factor, $S^2\sigma$, which, along with a minimum thermal conductivity of about 0.002 $Wcm^{-1}K^{-1}$, is reasonably expected to give rise to, or yield, a thermoelectric figure of merit, Z, of the order of $10^{-2}K^{-1}$ through the use of the composition of matter. This should be conducive to an energy conversion efficiency of nearly 43%, for thermoelectric power generators.

Magnesium may be replaced by one, or more, elements besides barium. Likewise, silicon may be replaced by one, or more, elements besides lead. This is conducive to compositions, having more comprehensive chemical constitutional formulas. Such additional elements, particularly replacing magnesium and/or silicon, may bring about an increase in both the average energy band gap as well as the average melting temperature of the resulting composition of matter. Such increases normally lead to a corresponding increase in the maximum hot junction temperature, at which the thermoelectric energy conversion device can be operated. Thus the Carnot, as well as the overall, energy conversion efficiency of the device will increase. On the other hand, the additional replacements of magnesium, and/or silicon, will end up reducing the exact, or minimum, atomic proportions of barium and lead, that would otherwise be required to bring about the absolute minimum lattice, as well as total, thermal conductivity. Consequently, the thermal conductivity of the resulting composition of matter will tend to increase, which is undesirable. The less barium and lead there is in the composition of matter, the higher the thermal conductivity will be. This will adversely affect the thermoelectric figure of merit, as well as the overall energy conversion efficiency. Therefore, the minimum atomic proportion of each of barium and lead in all the comprehensive constitutional formulas has been set at 10%. This will ensure that the thermal conductivity of the composition of matter, defined by the comprehensive formulas, will not considerably increase, while taking advantage of any possible increases in the operating hot junction temperature, thermoelectric power and thermoelectric power factor, that the additional elements, replacing part of magnesium and/or part of silicon, may bring about.

The additional elements, partially replacing magnesium and/or silicon, may be regarded as simple substitutes aimed at possibly increasing the thermoelectric power factor and figure of merit as indicated above or alternatively, as doping materials, or agents, earmarked for producing either an n-type or a p-type composition of matter.

A detailed description is now given of how to prepare the composition of matter either by melt-metallurgical methods or powder metallurgy. Melt-metallurgical processes, with certain precautions, are more likely to produce a material that is a single crystal, although this is very difficult. In this respect, the best chance of obtaining a monocrystalline material would be through the use of the heat exchanger method, known in the art as HEM. Producing a single crystal material is probably not that important. Manufacturing magnesium silicide, $Mg_2Si$, for example, by the powder metallurgy technique brings about a material with superior thermoelectric properties, and figure of merit. Because the composition of matter is substantially constituted by magnesium silicide, the powder metallurgy technique comes prominently into the picture and is, therefore, the method most recommended for the preparation thereof. Certain precautions, however, must strictly be adhered to both during the preparation stage as well as during the long-term operation of the material produced by the powder metallurgy technique. The precautions include avoiding all kinds of exposure to atmospheric oxygen, by preparing and operating the composition of matter under an absolute vacuum or, preferably, in an inert gas atmosphere, preferably comprising argon, maintained at a certain pressure, higher than atmospheric, or barometric, pressure. The precautions can partly be met through another embodiment of this invention, comprising encapsulation.

The performance and efficiency of the device for direct thermoelectric energy conversion comprising the composition of matter, can be improved through the use of the functionally graded material technique, or FGM method. Alternatively, the cascaded, or segmented, FGM technique may be used, wherein the number of cascades, segments, or stages, varies from three to four. Also the technique of integrated circuits, known in the art as I.C. technology, can be used in the manufacture of devices for direct thermoelectric energy conversion, comprising the composition of matter, wherein a multitude of p-type, and n-type, thermoelement pairs are connected in series and/or in parallel to generate an electric current of any strength and voltage, and, consequently, any power, in the case of thermoelectric power generators, or any cooling or heating capacity, in the case of thermoelectric refrigerators and thermoelectric heat pumps, respectively.

According to another embodiment or aspect of this invention, the additional doping materials for the n-type branch of the device, as defined in the preceding first embodiment, comprise one, or more, elements, selected from the group consisting of nitrogen, phosphorus, arsenic, antimony, bismuth, oxygen, sulfur, selenium, tellurium, chlorine, bromine, iodine, magnesium, barium, lithium, gold, aluminum, indium, iron and/or compounds thereof.

According to another embodiment or aspect of this invention, the additional doping materials, for the p-type branch of the device, as defined in the preceding first embodiment, comprise one, or more, elements, selected from the group consisting of copper, silver, sodium, potassium, rubidium, cesium, boron, silicon, lead and/or compounds thereof.

According to another embodiment or aspect of this invention, as defined in the preceding three embodiments, r varies from 0.1 to 0.4, (1−r) varies from 0.6 to 0.9, x varies from 0.1 to 0.3 and (1−x) varies from 0.7 to 0.9, the atomic, or molecular, proportion of the doping material, or materials, in the alloy varies from $10^{-8}$ to $10^{-1}$ and the free charge carrier concentration varies from $1 \times 10^{15}$ to $5 \times 10^{20}$ carriers cm$^{-3}$.

According to another embodiment or aspect of this invention, a process for producing a device for direct thermoelectric energy conversion, consisting of a p-type branch or thermoelement, an n-type branch or thermoelement, a hot junction and a cold junction, comprises the use of a composition of matter in the manufacture of the n-type branch and/or p-type branch of the device, wherein the composition of matter comprises magnesium silicide, $Mg_2Si$, wherein part of magnesium is replaced by barium, and part of silicon is replaced by lead, wherein the composition of matter thus is an alloy, or solid solution, of intermetallic compounds, containing magnesium silicide, magnesium plumbide, barium silicide and barium plumbide, wherein the composition of matter has the following constitutional formula:

$$Ba_{2r}Mg_{2(1-r)}Si_{1-x}Pb_x$$

wherein r, (1−r), (1−x) and x represent the atomic proportion of each of barium, magnesium, silicon and lead in the alloy, respectively.

According to another embodiment or aspect of this invention, in the preceding embodiment, r varies from 0.1 to 0.4, (1−r) varies from 0.6 to 0.9, x varies from 0.1 to 0.3 and (1−x) varies from 0.7 to 0.9.

According to another embodiment or aspect of this invention, a process for producing a device for direct thermoelectric energy conversion, consisting of a p-type branch or thermoelement, an n-type branch or thermoelement, a hot junction and a cold junction, comprises the use of a composition of matter in the manufacture of the n-type branch and/or p-type branch of the device, wherein the composition of matter in its most general form, comprises magnesium silicide, $Mg_2Si$, wherein part of magnesium is replaced by one, or more, elements, selected from the group consisting of beryllium, calcium, strontium and barium, and wherein part of silicon is replaced by one, or more, elements, selected from the group comprising germanium, tin, lead, antimony, bismuth, selenium and tellurium, and wherein the composition of matter has the following generic constitutional formula:

$$(Be, Ca, Sr, Ba)_{2r}Mg_{2(1-r)}Si_{1-s}(Ge, Sn, Pb, Sb, Bi, Se, Te)_s$$

and wherein the composition of matter has the following, more specific, form of the above generic constitutional formula:

$$Be_{2u}Ca_{2v}Sr_{2w}Ba_{2z}Mg_{2(1-r)}Si_{1-s}Ge_aSn_bPb_cSb_d\text{-}Bi_eSe_fTe_g$$

wherein r=u+v+w+z represents the sum of the atomic proportions of the elements that replace part of magnesium, and wherein s=a+b+c+d+e+f+g represents the sum of the atomic proportions of the elements that replace part of silicon, and wherein the composition of matter optionally contains one, or more, additional doping materials.

According to another embodiment or aspect of this invention, the additional doping material, or materials, for the n-type branch of the device, in the foregoing embodiment, comprise one, or more, elements, selected from the group consisting of nitrogen, phosphorus, arsenic, antimony, bismuth, oxygen, sulfur, selenium, tellurium, chlorine, bromine, iodine, magnesium, barium, lithium, gold, aluminum, indium, iron, and/or one, or more, of the compounds of these elements.

According to another embodiment or aspect of this invention, the additional doping material, or materials, for the p-type branch of the device, in the preceding seventh embodiment, comprise one, or more, elements, selected from the group consisting of copper, silver, sodium, potassium, rubidium, cesium, boron, silicon, lead and/or one, or more, of the compounds of these elements.

According to another embodiment or aspect of this invention, in the foregoing three embodiments, r varies from 0.1 to 0.4, (1−r) varies from 0.6 to 0.9, each of u, v and w varies from 0 to 0.3, (u+v+w) varies from 0 to 0.3, z is not less than 0.1, s varies from 0.1 to 0.3, (1−s) varies from 0.7 to 0.9, each of a, b, d, e, f and g varies from 0 to 0.2, (a+b+d+e+f+g) varies from 0 to 0.2, c is not less than 0.1, the atomic, or molecular, proportion of the doping material, or materials, in the alloy varies from $10^{-8}$ to $10^{-1}$ and the free charge carrier concentration varies from $1 \times 10^{15}$ to $5 \times 10^{20}$ carriers cm$^{-3}$.

According to another embodiment or aspect of this invention, a process for producing a device for direct thermoelectric energy conversion, consisting of a p-type branch or thermoelement, an n-type branch or thermoelement, a hot junction and a cold junction, comprises the use of a composition of matter in the manufacture of the n-type branch and/or p-type branch of the device, wherein the composition of matter, in its most general form, comprises magnesium silicide, $Mg_2Si$, wherein part of magnesium is replaced by one, or more, elements, selected from the group consisting of beryllium, calcium, strontium and barium, and wherein part of silicon is replaced by one, or more, elements, selected from the group comprising germanium, tin, lead, antimony, bismuth, selenium and tellurium, and wherein the composition of matter has the following generic constitutional formula:

$$(Be, Ca, Sr, Ba)_{2r}Mg_{2(1-r)}Si_{1-s})Ge, Sn, Pb, Sb, Bi, Se, Te)_s$$

and wherein the composition of matter has the following, more specific, form of the above generic constitutional formula:

$$Be_{2u}Ca_{2v}Sr_{2w}Ba_{2z}Mg_{2(1-r)}Si_{1-s}Ge_aSn_bPb_cSb_d\text{-}Bi_eSe_fTe_g$$

wherein $r=u+v+w+z$ represents the sum of the atomic proportions of the elements that replace part of magnesium, and wherein $s=a+b+c+d+e+f+g$ represents the sum of the atomic proportions of the elements that replace part of silicon.

According to another embodiment or aspect of this invention, in the foregoing embodiment, r varies from 0.1 to 0.4, (1−r) varies from 0.6 to 0.9, each of u, v and w varies from 0 to 0.3, (u+v+w) varies from 0 to 0.3, z is not less than 0.1, s varies from 0.1 to 0.3, (1−s) varies from 0.7 to 0.9, each of a, b, d, e, f and g varies from 0 to 0.2, (a+b+d+e+f+g) varies from 0 to 0.2, and c is not less than 0.1.

According to another embodiment or aspect of this invention, the thermoelements or branches, of the device for direct thermoelectric energy conversion, as defined in the foregoing embodiments, whether n-type or p-type, are manufactured conforming to the functionally graded material technique, known as the FGM method, wherein the chemical composition and/or energy band gap and/or doping level and/or concentration of the free charge carriers vary continuously from the hot junction to the cold junction, wherein the electrical conductivity is maintained constant along each of the thermoelements.

According to another embodiment or aspect of this invention, the thermoelements, or branches, of the device for direct thermoelectric energy conversion, as defined in the foregoing embodiment, are manufactured according to the cascaded, or segmented, FGM technique, wherein the number of cascades, segments or stages varies from three to four, and wherein the chemical composition and/or energy band gap and/or doping level and/or concentration of the free charge carriers remain constant along each segment, or stage, but vary continuously from one stage to another, along each thermoelement, or branch, wherein the doping level, or impurity concentration, varies from a lower value at the cold junction to a higher value at the hot junction.

According to another embodiment or aspect of this invention, the n-type and/or p-type thermoelements, or branches, of the device for direct thermoelectric energy conversion, as defined in the above embodiments, are manufactured according to the thin film technology, wherein the thickness, or length, of the n-type and/or p-type branches, or thermoelements, is thereby substantially downsized, or reduced, which is eventually conducive to a substantial downsizing of, or reduction in, the overall dimensions, as well as an increase in the energy conversion efficiency, of the device.

According to another embodiment or aspect of this invention, the n-type and/or p-type thermoelements, or branches, as defined in the above embodiments, are encapsulated inside, covered or surrounded by a very thin layer of a material that is a very bad conductor of both heat and electricity, namely a good thermal and electrical insulator, wherein the thin layer, or capsule, makes no contact with the hot and cold junctions, makes very little contact with the lateral surface of each thermoelement, and extends preferably over the entire length thereof, wherein the contact, or contacts, are very close to the hot and cold junctions, wherein the capsule is of circular, or quasi-square or -rectangular cross-section, wherein the material does not instantly, and in the long run, interact chemically, or by diffusion, with the composition of matter, which the n-type and p-type branches are composed of, wherein the capsule material has a very high chemical and mechanical stability, and is very resistant to acids, corrosion and high temperatures, and wherein the thin layer or capsule material comprises at least one compound, selected from the group consisting of the carbides, nitrides and oxides of beryllium, magnesium, calcium, strontium, barium, titanium, zirconium, hafnium, vanadium, niobium, tantalum, scandium, yttrium, chromium, molybdenum, tungsten, lanthanum and the rest of the elements of the lanthanide series, between lanthanum and hafnium, in the periodic table.

According to another embodiment or aspect of this invention, a multitude of the n-type and p-type branches, each pair, or couple, thereof constituting a single device for direct thermoelectric energy conversion, as defined in the above embodiments, are manufactured and assembled according to the technology of integrated circuits, known in the art as I.C. technology, wherein the devices are connected in series, or in parallel, or a combination of both, in order to generate an electric current of any amperage, or strength, and voltage, and consequently, any power, in the case of thermoelectric power generators, or in order to cope with any cooling or heating load, in the case of thermoelectric refrigerators and thermoelectric heat pumps, respectively, the manufacturing and assembly method, as herein described, being conducive to a substantial further reduction in the overall size, as well as a further increase in the overall energy conversion efficiency, or coefficient of performance, of thermoelectric devices in the future, regardless of their power generating, cooling load or heating load capacities.

According to another embodiment or aspect of this invention, all three methods, namely the thin film technology, the integrated circuit technology and the encapsulation technique are combined together in the design, manufacture and assembly of the devices for direct thermoelectric energy conversion, as defined in the preceding three embodiments, wherein the encapsulation method, or technique, or the configuration and contour of the capsule itself, may be somewhat changed, or modified, in order to adapt it to both the thin film and integrated circuit technologies that are being simultaneously used, or applied, in the construction and assembly of the thermoelectric energy conversion devices.

According to another embodiment or aspect of this invention, a convenient method of preparing, or producing, a composition of matter, as defined by any of the following two constitutional formulas:

$$Ba_{2r}Mg_{2(1-r)}Si_{1-x}Pb_x \qquad (1)$$

or $$Be_{2u}Ca_{2v}Sr_{2w}Ba_{2z}Mg_2(1-r)Si_{1-x}Ge_aSn_bPb_cSb_d\text{-}Bi_eSe_fTe_g \qquad (2)$$

and according to any of the preceding embodiments, comprises admixing predetermined proportions of the starting elements, which must be of the utmost possible purity, to avoid unwanted doping, wherein the starting elements comprise either magnesium, silicon, lead and barium, according to formula (1) above, as well as any additional doping material, or materials, if necessary, or one, or more, elements, selected from the group comprising beryllium, calcium, strontium and barium, along with the elements magnesium and silicon, constituting the compound magnesium silicide, $Mg_2Si$, and one, or more, elements, selected from the group comprising germanium, tin, lead, antimony, bismuth, selenium and tellurium, according to formula (2) above, as well as any additional doping material, or materials, wherein the starting elements and additional doping materials, if any, are preferably in the form of granules, or as a fine powder, and charging the starting elements, and additional doping materials, within a vessel, receptacle, boat or crucible, of suitable dimensions and shape, and made of a material that will not chemically react with, or contaminate, the constituents of the composition of matter, alloy or solid solution, to be produced, thus avoiding any unwanted or unintended doping, wherein the material is preferably composed of one or more elements, selected from the group consisting of tungsten, rhenium, ruthenium, rhodium, palladium, platinum, gold, iridium, osmium, tantalum, hafnium, zirconium, titanium, molybdenum, chromium, vanadium and niobium, or wherein the material is alternatively composed of at least one compound, selected from the group consisting of the carbides, nitrides and oxides of beryllium, magnesium, calcium, strontium, barium, titanium, zirconium, hafnium, tantalum, lanthanum and the rest of the elements comprising the lanthanide group, between lanthanum and hafnium, placing the receptacle, crucible or boat concentrically inside an appropriate furnace, wherein the furnace operates according to the temperature gradient freeze technique, wherein the furnace and technique are commonly known as the Bridgman furnace and the Bridgman crystal growing technique, respectively, wherein in the standard version of the Bridgman technique, the configuration of both furnace and boat, or crucible, is vertical, and wherein in the modified, or non-conventional, version of the technique, the disposition of both the furnace and boat is horizontal, wherein the inside of the furnace, or enclosure, in which the vertical crucible, or horizontal boat, is placed, is subsequently completely evacuated of air, down to an absolute pressure of preferably from $10^{-4}$ to $10^{-6}$ millimeters of mercury, and then filled with an inert gas, preferably helium or argon, which is maintained under a relative pressure of approximately between 2 and 30 physical atmospheres, or 2 to 30 bars, and then hermetically sealed, whereby the excessive loss of magnesium, due to its high volatility, relative to that of barium, lead and silicon is suppressed, since the boiling points of the basic ingredients are 1363K, 2170K, 2022K and 3538K, respectively, while the melting point of silicon is 1687K, wherein the starting elements, along with the doping material, are thus heated to a temperature about 15° C. to 30° C. above the melting point of silicon, which is the ingredient that has the highest melting point, since the melting points of the other three constituents: magnesium, barium, and lead are 923K, 1000K and 600.6K, respectively, wherein the starting elements: magnesium, barium, lead and silicon, as well as the doping impurity, if any, are heated to preferably between 1700K and 1715K, to assure the complete melting of silicon first, and then maintained at that temperature for about 2 to 3 hours, to allow sufficient time for the necessary chemical reactions, namely between magnesium and each of silicon and lead, and between barium and each of silicon and lead, to take place, as well as for thorough mixing of the resulting compounds and the formation of a homogeneous alloy, or solid solution, wherein no chemical reactions should, or are expected to, take place directly between magnesium and barium, or between silicon and lead, wherein the electronegativity difference between magnesium and barium is 0.42, while that between silicon and lead is 0.43, wherein the electronegativity difference between magnesium and each of silicon and lead is 0.59 and 1.02, respectively, while that between barium and each of silicon and lead is 1.01 and 1.44, respectively, wherein the former two electronegativity differences, namely 0.42 and 0.43 are much smaller than the latter four, namely 0.59, 1.02, 1.01 and 1.44, wherein this precludes any chemical reaction, or the formation of chemical compounds, directly between magnesium and barium, as well as between silicon and lead, wherein this allows, on the other hand, the occurrence of chemical reactions, and the consequent formation of chemical compounds, between magnesium and each of silicon and lead, as well as between barium and each of silicon and lead, wherein the above conclusions can also be inferred, quite independently, from the electronic structure of the above elements, as indicated in the Periodic Table of the Elements, as seen in FIG. 2, wherein the composition of matter, namely the magnesium barium silicide plumbide alloy, or solid solution, with or without doping, after having been maintained for 2 to 3 hours at, preferably, between 1700K and 1715K, is then allowed to cool very slowly down to the room temperature, wherein the temperature of the furnace is first reduced from preferably between 1700K and 1715K over a period of preferably from 12 to 24 hours, until the hottest part of the charge, or ingredients, in the crucible, or boat, is about 5° C. below the solidus temperature of the particular alloy composition being produced, wherein a rate of solidification, where the isothermal solid-liquid interface moves at approximately 1 to 5 millimeters per hour, should give satisfactory results, wherein specifically the ability to maintain a linear temperature gradient along the entire length of the crucible, and to maintain an arcuate solid-liquid interface, which is concave into the liquid phase, during the crystal growth process, generally leads to the manufacture of single crystal alloys, having relatively few crystal dislocations, and materially reduced imperfections, such as microscopic cracks and uneven crystal growth.

There is no way, however, to assure that a single crystal solid solution, or alloy, could be obtained, especially with a material comprising four elements having such widely varying atomic masses, atomic radii, densities, specific heats and thermal conductivities. It is more likely that a polycrystalline material will eventually emerge as a result, or consequence, of the aforementioned situation, that is, because of the atomic and physical properties. About the most that can be expected from the aforementioned preparation, and crystal growing, method is a polycrystalline material, with several grains, all of them quite large. That would probably be about the closest one could get to a single crystal magnesium barium silicide plumbide alloy, or solid solution, defined by any of the following two constitutional formulas:

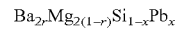

or

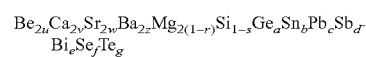

According to another embodiment or aspect of this invention, a convenient method of preparing or producing a composition of matter, as defined in the above first eleven embodiments, comprises admixing predetermined proportions of the starting elements, which must be of the utmost possible purity, to avoid unwanted doping, wherein the starting elements comprise either magnesium, silicon, lead and barium, constituting a composition of matter defined by the chemical formula:

$$Ba_{2r}Mg_{2(1-r)}Si_{1-s}Pb_x$$

as well as any additional doping material, or materials, if necessary, or desired, or comprise the elements magnesium and silicon, constituting the compound magnesium silicide, $Mg_2Si$, and one or more elements, selected from the group comprising beryllium, calcium, strontium and barium, replacing part of magnesium, and one or more elements, selected from the group consisting of germanium, tin, lead, antimony, bismuth, selenium and tellurium, substituting for part of silicon, and constituting another composition of matter defined by the chemical formula:

$$Be_{2u}Ca_{2v}Sr_{2w}Ba_{2z}Mg_{2(1-r)}Si_{1-s}Ge_aSn_bPb_cSb_d\text{-}Bi_eSe_fTe_g$$

as well as any additional doping material or materials, wherein the starting elements and additional doping materials, if any, are preferably in the form of granules, or as a fine powder, and charging the starting elements, and additional doping materials, within a vessel, or crucible, of suitable dimensions and shape, and made of a material that will not chemically react with, or contaminate the constituents of the composition of matter, alloys or solid solutions to be produced, thus avoiding any unwanted or unintended doping, wherein the material is preferably composed of one, or more, elements, selected from the group consisting of tungsten, rhenium, ruthenium, rhodium, palladium, platinum, gold, iridium, osmium, tantalum, hafnium, zirconium, titanium, molybdenum, chromium, vanadium and niobium, or wherein the material is, alternatively, preferably composed of at least one compound, selected from the group consisting of the carbides, nitrides and oxides of beryllium, magnesium, calcium, strontium, barium, titanium, zirconium, hafnium, tantalum, lanthanum and the rest of the elements comprising the lanthanide group, between lanthanum and hafnium, wherein the crucible, with the ingredients contained therein, is then evacuated of air down to an absolute pressure of preferably from $10^{-4}$ to $10^{-6}$ millimeters of mercury, and then filled with an inert gas, preferably helium or argon, up to a relative pressure of approximately from 2 to 30 physical atmospheres, or 2 to 30 bars, and finally hermetically sealed, wherein the crucible is then concentrically placed inside a horizontal, or vertical, furnace and heated so as to subject the constituents of the composition of matter contained therein to a temperature higher than the melting point of silicon, which is 1687K, wherein the molten ingredients are thus maintained at a temperature of preferably from 1700K to 1735K for about 15 to 30 minutes to guarantee the complete melting of silicon and, consequently, the formation of the compound $Mg_2Si$, wherein the temperature of the melt is then allowed to drop gradually during the next 20 to 30 minutes to about 1500K, and maintained at this level for not less than 20 minutes, wherein the constituents of the composition of matter are then held in a completely molten condition for a period long enough to ensure the formation of the intermetallic compounds, and the production of a mixture thereof having a uniform composition, wherein the period, which may be termed the mixing period, usually lasts for at least one hour, wherein while the contents of the crucible are in the liquid state, they are subjected to an intense agitation, so as to become intimately mixed together, and thus produce a homogeneous alloy, wherein the agitation of the crucible contents is effected by intermittently picking the crucible up with tongs, shaking it and turning it over in the furnace, wherein a rocking-type furnace may also be used to effect agitation of the crucible contents, wherein after the mixing period, the so-obtained composition of matter is cooled at a rate of from, approximately, 2° C. to 20° C. per hour, wherein the rate of cooling is continued until ambient temperature is reached, wherein, alternatively, cooling may be carried on until a temperature of about 400° C. is reached, from which point the cooling rate may be increased to preferably from 50° C. to 100° C. per hour, wherein the so-produced composition of matter, or alloy, is finally removed from the crucible, and is normally a polycrystalline material that may be used in the manufacture of thermoelectric energy conversion devices.

According to another embodiment or aspect of this invention, a convenient method of preparing or producing a composition of matter as defined in the above first eleven embodiments, comprises separately producing each of the intermetallic compounds necessary according to any of the following two constitutional formulas:

$$Ba_{2r}Mg_{2(1-r)}Si_{1-x}Pb_x \qquad (1)$$

or $$Be_{2u}Ca_{2v}Sr_{2w}Ba_{2z}Mg_{2(1-r)}Si_{1-s}Ge_aSn_bPb_cSb_d\text{-}Bi_eSe_fTe_g \qquad (2)$$

by admixing and heating predetermined stoichiometric amounts of their constituents to temperatures about 50° C. higher than the melting points of the respective compounds, wherein the compounds are prepared by heating Mg and Si, Mg and Pb, Ba and Si, and Ba and Pb to the appropriate temperatures, if the constitutional formula desired is No. (1), wherein the same, or other, element combinations may be required, should the composition of matter be prepared according to formula No. (2), wherein a heating temperature much higher than the melting point of the compound is required for the production of $Mg_2Si$ and $BaSi_2$, to assure the complete melting of silicon, wherein the remaining steps consist of maintaining the molten ingredients at the appropriate temperatures for about one hour, preferably under intense agitation and an argon atmosphere having a relative pressure of preferably from 2 to 30 physical atmospheres, or 2 to 30 bars, approximately, and then cooling the resulting compounds very gradually to the ambient temperature, wherein the so-obtained compounds are then mixed together in the required proportions, preferably, after granulation or pulverization, and then charged into a crucible of suitable dimensions and shape, wherein an appropriate amount of a suitable doping material, or agent, is optionally introduced during the mixing of the intermetallic compounds, wherein part, or all, of the doping impurity, or agent, is preferably added during melting, wherein the crucible, with the ingredients contained therein, is then evacuated to an absolute pressure of preferably, from $10^{-4}$ to $10^{-6}$ millimeters of mercury, wherein the crucible is then filled to a suitable pressure, preferably, to a relative pressure of from 2 to 30 bars, or 0.2 to 3 MPa, or approximately 2 to 30 physical atmospheres, with an inert gas, like helium or argon, preferably argon, and finally hermetically sealed, wherein the crucible is then concentrically placed inside a horizontal or vertical furnace, and heated to a temperature a few degrees higher than the melting point of the compound that has the highest melting temperature of all the constituent compounds, to ensure the complete melting of all the ingredients, wherein while the constituents of the composition of matter are in the molten state, they are subjected to an intense agitation by means of any of the methods described in the preceding embodiment, wherein the contents of the crucible are thus maintained at the appropriate temperature for about one hour, whereby a homogeneous alloy, or solid solution, is obtained, wherein the composition of matter, or alloy, is then cooled at a rate of from approximately 2° C. to 20° C. per hour, wherein the rate of cooling is continued until the ambient temperature is reached, wherein, alternatively, the cooling rate may be carried on until a temperature of about 400° C. is reached, from which point, the cooling rate may be increased to preferably from 50° C. to 100° C. per hour, whereby the so-produced composition of matter, or alloy, is finally removed from the crucible.

The alloy, or composition of matter, produced according to either one of the preceding two embodiments, is normally homogeneous and polycrystalline. It is strained and contains a large number of dislocations. To prevent or reduce strains in the so-obtained alloy, its constituents are preferably initially charged and melted in a soft mold, made of a very thin, easily deformable, platinum sheet or foil, instead of charging them in a rigid crucible. Such a mold deforms, as the molten ingredients expand during freezing, resulting in no introduction of strain in the material. The mold, or container, may be supported, for extra strength, by a stronger external crucible made of graphite, stainless steel, or any suitable refractory material. Before being used in the manufacture of thermoelectric energy conversion devices, however, the composition of matter, or alloy, may be converted into a monocrystalline, or single crystal, material. The production of such an alloy, or material, may be achieved in a number of ways. One such method is the temperature gradient freeze technique, also known in the art as the Bridgman method.

According to another embodiment or aspect of this invention, preparation of a single crystal, or monocrystalline, barium magnesium silicide plumbide alloy, or solid solution, having the constitutional formula:

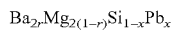

$Ba_{2r}Mg_{2(1-r)}Si_{1-x}Pb_x$ may be effected by charging the polycrystalline material, prepared according to any one of the preceding three embodiments, in an open elongated horizontal crucible, usually called the boat, of suitable dimensions and shape, wherein the boat consists of a bottom wall which integrally merges into a pair of sidewalls, and a pair of transverse end walls, wherein the boat, or crystallizing container, is then suitably placed inside an ampule which is evacuated to an absolute pressure of from $10^{-4}$ to $10^{-6}$ millimeters of mercury, wherein the ampule is then, preferably, filled to a relative pressure of from approximately 2 to 30 physical atmospheres, or 0.2 to 3 MPa, with an inert gas, preferably argon, and finally hermetically sealed, wherein the horizontal crucible, or boat, is preferably made of a material composed of at least one compound selected from the group consisting of the carbides, nitrides and oxides of beryllium, magnesium, calcium, strontium, barium, titanium, zirconium, tungsten, hafnium, tantalum, lanthanum and the rest of the elements comprising the lanthanide group, between lanthanum and hafnium, or wherein the horizontal boat, or crucible, is preferably made of a material composed of one, or more, elements, selected from the group consisting of tungsten, rhenium, ruthenium, rhodium, palladium, platinum, gold, iridium, osmium, tantalum, hafnium, zirconium, titanium, molybdenum, chromium, vanadium and niobium, wherein the ampule may be made of stainless steel or, alternatively, one, or more, of the aforementioned refractory compounds, wherein the ampule is concentrically placed within an open-ended tubular heat conducting sleeve, which is closed at the heat gathering end, by a removable heat insulating plug, wherein the sleeve is made of a material having a thermal conductivity higher than that of the boat and the contents thereof, wherein a tubular heat insulating sleeve is concentrically disposed around, and extends axially along, the heat conducting sleeve, wherein the assembly is then placed in a furnace provided with a heating element which is designed to bring about a linear temperature differential between the two ends of the furnace, wherein the furnace is then heated until the coolest end of the ingot has reached a minimum temperature equivalent to the liquidus temperature of the particular alloy composition being prepared, wherein the furnace is maintained at the minimum temperature for at least one hour to assure complete melting of the crucible contents, wherein the temperature of the furnace is then reduced over a period of from 12 to 24 hours until the hottest part of the charge in the boat is about 5° C. below the solidus temperature of the particular alloy composition being produced, wherein a rate of solidification where the isothermal solid-liquid interface moves at approximately 1 to 5 millimeters per hour has been found to give satisfactory results.

The apparatus assembly described in the above embodiment, comprising a heat insulating sleeve, a heat conducting sleeve, a horizontal boat, an ampule and a specially designed heating element, actually enables one to maintain a linear temperature gradient along the entire length of the crucible, and to maintain an arcuate solid-liquid interface, which is concave into the liquid phase, during the crystal growth process. The aforementioned precautions have generally led to the manufacture of single crystal alloys, having relatively few crystal dislocations, and materially reduced imperfections, such as microscopic cracks and uneven crystal growth.

It should be appreciated, moreover, that the above-mentioned steps, comprising mixing, heating and reacting the constituents of the composition of matter, or alloy, as well as the production of the mono- or polycrystalline structure related thereto, may all be consecutively carried out in a single apparatus, such as, for example, the temperature gradient freeze apparatus assembly just described above. Longer periods should, in this case, be maintained to allow sufficient time for the necessary chemical reactions, between the individual elements, to be completed, as well as for the achievement of a homogeneous solid solution, or alloy. An excess of magnesium, above the quantity required by stoichiometry, is preferably incorporated in the mixture before heating, to compensate for any excessive loss of this element, by evaporation, owing to its high volatility relative to that of the other three elements: silicon, lead and barium. The quantity of excess magnesium added is adjusted in such a way that a stoichiometric composition of matter, or alloy, is finally obtained.

The high volatility of magnesium originates from the fact that the melting point of silicon is 1687K, whereas the boiling points of the aforementioned four elements, namely magnesium, silicon, lead and barium, are 1363K, 3538K, 2022K and 2170K, respectively. Since silicon possesses the highest melting point of all four elements, namely 1687K, and since the latter temperature is about 300K higher than the boiling point of magnesium, it is this difference in temperature that brings about the high volatility of that element.

The so-produced composition of matter, or alloy, may be finally subjected, preferably, to either one of the processes known in the art as zone refining and zone melting. This final step, or procedure, in conjunction with an intense agitation of the molten ingredients during the preparation of the solid solution, assure the production of an adequately homogeneous alloy.

The purity of the starting elements needed for the production of this composition of matter, or solid solution, namely magnesium, silicon, lead and barium, expressed as percentage by weight, should preferably be higher than 99.999 for each one of them. A purity level, substantially higher than the latter figure, is preferred for silicon, lead and barium.

The composition of matter, or alloy, may still be produced, or prepared, using the heat exchanger method, known in the art as HEM. Although the HEM has not hitherto had widespread commercial application, yet it offers potential for substantial cost reductions in large scale manufacturing. The HEM is a directional solidification technique, which has been adapted for the growth of large square cross-section silicon ingots from the melt.

The HEM technique incorporates a furnace for material growth under a reducing, or neutral, gas atmosphere. The furnace consists of a graphite heat zone, backed by layers of graphite insulation. This assembly is placed in a vacuum-tight, water-cooled, stainless steel chamber. Heat is supplied by a picket-fence type graphite heater, resistively powered by an appropriate three-phase power supply. A high-temperature heat exchanger is inserted through the bottom of the chamber and heat zone. This heat exchanger is a closed end tube, with an injection tube for the flow of helium gas as a coolant. There are no moving parts in the HEM furnace, thus minimizing the seals required. Furthermore, the solid-liquid interface is submerged below the melt, hence only a small observation port is incorporated at the top of the furnace. Other ports in the furnace are for evacuation, and for the control and measurement pyrometers. These features allow a design of a well insulated heat zone. The control instrumentation is tied to a standard, dual-channel, microprocessor, which can be easily programmed for heat input, as well as heat extraction.

The heat zone is designed such that, with no coolant flow through the heat exchanger, there are no significant gradients built in the furnace. This is achieved with thermal symmetry, multilayer insulation all around the heat zone, and minimization of sight ports. Some natural temperature gradients are expected, for instance, at the edges of the heating element. The temperature along the crucible wall is nearly constant in the HEM furnace. This feature distinguishes the HEM from the temperature gradient freeze techniques.

The heat exchanger method, HEM, has been developed to grow large high quality crystals. A seed crystal is placed at the bottom of the crucible, which is seated on a high temperature heat exchanger. The feedstock, or charge, comprising the basic ingredients of the composition of matter to be produced, namely magnesium, silicon, lead and barium, is then loaded into the crucible on top of the seed crystal. After evacuation, the furnace enclosure is filled with an inert gas, preferably argon, up to a relative pressure of preferably between 2 and 30 physical atmospheres, to suppress the excessive loss of magnesium that may occur, due to its high volatility relative to that of the other three constituents. Heat is then supplied by the graphite heater, and the charge is melted. The seed is prevented from melting, by forcing minimal gaseous helium flow through the heat exchanger. After melt back of the seed, growth is progressed by increasing the flow of helium, and thereby decreasing the heat exchanger temperature.

In essence, this method involves directional solidification from the melt, where the temperature gradient in the solid is controlled by the heat exchanger, and the gradient in the liquid is controlled by the furnace temperature. After solidification is complete, the gas flow through the heat exchanger can be decreased to equilibrate the temperature throughout the crystal, during the annealing and cool down stage.

This technique is unique in that the liquid temperature gradient can be controlled independently of the solid gradient, without moving the crucible, heat zone or ingot. The most significant feature is the submerged interface which is stabilized by the surrounding liquid. It is protected from hot spots, mechanical vibration and convection currents. Consequently, rotation of the crucible is not necessary to achieve thermal symmetry.

Growth with a submerged interface makes HEM ideally suited for low purity silicon, where many of the second phase contaminants, such as carbides and oxides, tend to float on the surface of the melt, away from the growing interface. The melt acts as a buffer and protects the submerged solid-liquid interface during most of the growth cycle. Therefore, the temperature, and concentration, fluctuations at the interface are minimized in HEM, because of the surrounding liquid. During growth, the colder material is at the bottom, and the hotter melt is on the top. This minimizes convection and, therefore, growth occurs under stabilizing temperature gradients. The minimization of temperature, and concentration, fluctuations, along with stabilizing temperature gradients, minimize constitutional supercooling and promote uniform growth. This results in high crystal perfection and chemical homogeneity. This salient feature accounts for the unique capability of HEM to grow a nearly single crystal ingot in one solidification, using commercially available metallurgical grade silicon, as melt stock.

As the ingot growth proceeds, the size of the interface increases. Therefore, high growth rates are achieved with larger size ingots. As the distance of the interface from the heat exchanger increases, linear movement of the interface is slowed. However, volume growth rates are still increasing, because of the larger size of the interface. This feature is significant, when low purity melt stock is directionally solidified by HEM. As growth proceeds, impurities are rejected to the liquid, because of segregation effects. However, their effect is minimized, because of the increasing size of the interface. As more and more impurities are piled up in the liquid, the slowing linear growth suppresses constitutional supercooling.

In HEM, the stability of the submerged solid-liquid interface is evident from the fact that, when particles are entrapped on the interface, growth progresses around the particle without breakdown in structure. The absence of high local gradients at the interface, ensures the growth off the interface, in preference to off the particle. This is contradictory to the Czochralski process, where such entrapment would cause spurious nucleation and, therefore, multicrystalline growth.

The controllable heat exchanger of HEM allows precise control of the temperature, and temperature gradients, at the bottom of the crucible. This precise control of the interface also allows high growth rates, under low temperature gradients. This reduces solidification stresses that cause defect formation. Further, in situ annealing of the ingot can be accomplished after growth is complete, since the boule does not move out of the heat zone, during solidification. This is accomplished by reducing the temperature of the furnace just below the solidification temperature and then reducing the helium flow. The whole ingot can, therefore, be brought to high temperatures, and then cooled uniformly at a controlled rate. This further reduces internal stresses, and a costly, separate annealing step is eliminated. This annealing, and controlled cool down, prevents cracking due to thermal shock, thereby allowing large ingots to be produced.

The heat exchanger method, or HEM, is appropriate for the growth or production of the composition of matter, as defined by the basic chemical constitutional formula:

$$Ba_{2r}Mg_{2(1-r)}Si_{1-x}Pb_x \quad (1)$$

or the more general, and broader-scope, chemical constitutional formula:

$$Be_{2u}Ca_{2v}Sr_{2w}Ba_{2z}Mg_{2(1-r)}Si_{1-x}Ge_aSn_bPb_cSb_d\text{-}Bi_eSe_fTe_g \quad (2)$$

whether as a single crystal or a polycrystalline, material. Should this method be used, then no vibration, or agitation, of the molten ingredients in the crucible is required. No moving temperature gradients will be necessary either. However, careful attention must be paid to the following matters:

(1) Provision must be made so that the melting of the basic ingredients of the composition of matter, inside the crucible, produced according to any of the above two constitutional formulas, takes place under an inert gas atmosphere, preferably comprising helium or argon. This prevents the excessive loss of magnesium that may occur due to its high volatility, relative to that of the other three constituents, should the composition of matter be produced according to constitutional formula (1) above, and to prevent the excessive loss of magnesium, selenium, tellurium and, to a lesser extent, strontium, that may occur, for the same reason as above, should the composition of matter be produced according to the foregoing constitutional formula (2), by maintaining the gaseous environment at a relative pressure of, preferably, between 2 and 30 bars, or 0.2 and 3 MPa, wherein the crucible has been previously evacuated of air down to an absolute pressure of preferably from $10^{-4}$ to $10^{-6}$ millimeters of mercury, before being filled with the inert gas.

(2) The crucible to be used for melting the basic ingredients of the composition of matter should be composed of a material that will not contaminate, or chemically react with, the ingredients. Consequently, it should comprise a material, as described in another embodiment of this invention, disclosed earlier in this specification. For example, crucibles made of quartz, or even graphite, should be totally ruled out. They absolutely cannot and must not be used for producing, or preparing, the composition of matter, as set forth in the various embodiments of this invention, disclosed earlier in this specification.

The composition of matter may still be prepared, or produced, using a powder metallurgy technique. The latter has a definite advantage over the melt metallurgical methods, in that the excessive loss of magnesium and, possibly, also selenium, tellurium and strontium, should one or more of the latter three elements be also incorporated in the composition of matter, due to their relatively high volatility and high vapor pressure and, the consequent difficulty of producing perfectly stoichiometric compounds, and solid solutions, is thus avoided or overcome. Another advantage of the powder metallurgy method, versus the melt metallurgical techniques, is that there is no loss of homogeneity of the alloy produced, in case it comprises elements of widely varying atomic masses, or densities. A melt metallurgical technique, or process, would, under such circumstances, require an intense vibration, or agitation, of the molten ingredients, in order to assure complete homogeneity of the resulting solid solution. When the powder metallurgy technique is used to produce or grow the composition of matter, as defined by either the basic constitutional formula:

$$Ba_{2r}Mg_{2(1-r)}Si_{1-x}Pb_x$$

or the broader-scope constitutional formula:

$$Be_{2u}Ca_{2v}Sr_{2w}Ba_{2z}Mg2(1-r)Si_{1-s}Ge_aSn_bPb_cSb_d\text{-}Bi_eSe_fTe_g$$

any one of the following alternative procedures may be adopted, or pursued:

(1) The basic ingredients, namely the elements, are mixed and melted together. The resulting solid solution, or alloy, is then crushed and pulverized, normally in a planetary ball mill. The so-obtained powder is then subjected to hot pressing, in a hot uniaxial press, or cold pressing, and then sintering;

(2) The basic ingredients, or constituent elements, are crushed and pulverized in a planetary ball mill, and subjected to hot pressing in a hot uniaxial press, or cold pressing and then sintering, without having been initially subjected to melting; and (3) The individual, intermetallic compounds are prepared by mixing and melting the respective basic elements together. The so-produced compounds are then crushed and pulverized together in a planetary ball mill, and then subjected to hot pressing in a hot uniaxial press, or cold pressing and then sintering.

Whichever the powder metallurgy process selected is, care must be exercised such that crushing and pulverization of the ingredients is done only once. That is necessary, so that contamination, or unwanted doping, of the so-produced composition of matter with iron, usually coming from the steel grinding balls of the planetary ball mill, is reduced to the absolute minimum. Such doping or contamination must be eliminated altogether. The way to do this is to manufacture the grinding balls from a material that will not interact mechanically with the ingredients of the composition of matter that are being pulverized in the planetary ball mill. For example, a much harder type of steel could be selected for the production of the grinding balls. Special attention to the metallurgical composition, or constitution, as well as the necessary heat treatment, and resulting microstructure thereof, could solve this problem.

An alternative solution, to avoid, or eliminate, contamination due to pulverization, is to select a material, other than steel, for the manufacture of the grinding balls. This step may not be necessary, should a much harder type of steel be found, or selected, for the manufacture of the grinding balls. Otherwise, the selection of another material that will suffer no substantial erosion, or wear, whatsoever due to mechanical interaction, with the ingredients undergoing pulverization, will prove indispensable.

Should the powder metallurgy technique be utilized, according to any one of the above three procedures, the following should serve as worthwhile guidelines:

(1) If the basic ingredients, whether the starting elements or the intermetallic compounds themselves, have initially been mixed and melted together then cold uniaxial pressing, followed by sintering, is to be preferred;

(2) If the basic ingredients, whether the starting elements or the intermetallic compounds themselves, have not initially been melted together, then hot pressing of the mixture in a hot uniaxial press may be appropriate;

(3) To avoid further unwanted doping, or contamination, during execution of the powder metallurgy technique, regardless of which of the above two procedures is adopted, a platinum cylinder and a platinum plunger may be preferably used for either hot pressing, or cold pressing and then sintering, of the crushed and pulverized ingredients;

(4) The powder metallurgy technique, particularly the sintering as well as the hot pressing process, should preferably be carried out in an argon gas atmosphere. In other words, direct contact between the composition of matter, being produced, and atmospheric oxygen and moisture, or air in general, must be completely avoided during execution of the powder metallurgy technique. The same precaution applies also in relation to the long term operation of thermoelectric energy conversion devices comprising the composition of matter, namely as the basic material for the manufacturing of the n-type, or the n-type and p-type, branches thereof. These precautions are necessary in order to prevent the almost certain deterioration of the thermoelectric properties of the composition of matter, during the initial stage of powder metallurgy manufacturing, as well as during the long run use of the composition of matter for direct thermoelectric energy conversion;

(5) For the preparation of the composition of matter, as defined by either the basic or the broader-scope constitutional formulas:

$$Ba_{2r}Mg_{2(1-r)}Si_{1-x}Pb_x$$

or $$Be_{2u}Ca_{2v}Sr_{2w}Ba_{2z}Mg_{2(1-r)}Si_{1-s}Ge_aSn_bPb_cSb_d\text{-}Bi_eSe_fTe_g$$

respectively, by mechanical alloying, stoichiometric amounts of the constituent elements, in the form of chunk pieces ($\leq 5$ millimeters) are filled into vessels preferably made of very hard special alloy steel, or another appropriate material, of more or less 500 milliliter capacity, along with about 100 grinding balls, again preferably composed of a very hard special alloy steel, or another appropriate material, of nearly 10 millimeters in diameter each, and 150 milliliters n-hexane. The vials are sealed in an atmosphere of argon. The milling, or pulverization, process is preferably carried out in an appropriate planetary ball mill for 8 to 150 hours or any other appropriate period. Consolidation of the powders is preferably conducted in a hot uniaxial press in a vacuum, corresponding to an absolute pressure $p \leq 10^{-4}$ millibar, at a pressure of preferably 50 MPa, and at a temperature of preferably between 1073K and 1123K. Alternatively, consolidation of the powders may be carried out in an inert gas atmosphere, preferably argon. Alternatively, consolidation of the powders, or pulverized ingredients, may still be accomplished by cold pressing, in a cold uniaxial press, and then sintering at a temperature of preferably from 1073K to 1200K, preferably in a vacuum corresponding to an absolute pressure $p \leq 10^{-4}$ millibar or, alternatively, in an inert gas atmosphere, preferably argon; and (6) In order to further assure that no contamination, or unwanted doping, will occur during pulverization of the already crushed constituents, particularly with Fe, or iron, both the vessels and the grinding balls that are being used for that purpose, as the basic components of the planetary ball mill, should comprise the same special alloy steel of very high hardness. Should that prove not viable, or feasible, then another material, possessing an adequately high hardness, must be found or selected for that purpose. In other words, the steel alloy or alloys currently used in the manufacture of the aforementioned vessels and grinding balls must be replaced by a much harder material, whether it is another steel alloy or an entirely different material.

Recent experimental research work related to the preparation, temperature dependencies of the Seebeck coefficient, electrical resistivity and thermoelectric power factor, as well as the long term performance reliability, of magnesium silicide, $Mg_2Si$, when used for thermoelectric energy conversion, have shown that:

(1) The thermoelectric properties of a sample of $Mg_2Si$, prepared by the technique of powder metallurgy, namely by cold pressing and then sintering, in the temperature range from 1073K to 1200K in an argon atmosphere, are far better than those of a sample prepared from the melt, and which sample has also been exposed for various periods to atmospheric oxygen. In other words, preparing $Mg_2Si$ through the traditional method of casting, or melt metallurgy, while exposing it to atmospheric oxygen, is conducive to obtaining a material with substantially deteriorated Seebeck coefficient, electrical resistivity and thermoelectric power factor; and (2) The thermoelectric performance of a sample initially prepared by cold pressing and then sintering, in an argon atmosphere, deteriorates substantially after exposure to atmospheric air for different periods due to sublimation and oxidation of magnesium.

Thus, magnesium silicide, $Mg_2Si$, should be both prepared, as well as used, away from atmospheric air, namely in an inert gas atmosphere, preferably argon. Furthermore, the powder metallurgy technique, whether cold pressing and then sintering, or hot pressing, is far better than the traditional melt metallurgy method, as a means of preparing or producing the compound. As mentioned earlier, this is also contingent upon the aforementioned compound being kept away from atmospheric air or oxygen. That implies that magnesium silicide, $Mg_2Si$, must be prepared, as well as used, either under absolute vacuum or in an environment preferably composed of argon.

The same arguments and facts, set forth in the preceding two paragraphs, also apply to the composition of matter, as basically defined by the chemical constitutional formula:

$$Ba_{2r}Mg_{2(1-r)}Si_{1-x}Pb_x$$

Notwithstanding the fact that, in the above formula part of magnesium is replaced by barium and part of silicon is replaced by lead, still the composition of matter is essentially composed of magnesium silicide, $Mg_2Si$. Consequently, all the aforementioned statements and precautions regarding the preparation, temperature dependency of the thermoelectric properties, as well as the long term thermoelectric performance reliability of magnesium silicide, $Mg_2Si$, are substantially equally well applicable to the composition of matter, as defined by the above basic constitutional formula. Again, the same statements and precautions can be safely extended to cover, and are substantially equally applicable, to the composition of matter, as defined by the broader-scope constitutional formula:

$$Be_{2u}Ca_{2v}Sr_{2w}Ba_{2z}Mg_{2(1-r)}Si_{1-s}Ge_aSn_bPb_cSb_d\text{-}Bi_eSe_fTe_g$$

Alloy scattering is utilized as a powerful method to reduce the lattice thermal conductivity of thermoelectric materials. Since the lattice thermal conductivity is very nearly equal to the total thermal conductivity, particularly for semiconductors, at relatively low temperatures, this brings about an increase in the thermoelectric figure of merit of these materials. Consequently, the most useful thermoelectric materials are alloys, or solid solutions, because their lattice thermal conductivity is reduced due to alloy scattering. Simultaneously, however, the electrical mobility, along with the electrical conductivity, are also generally lowered by alloying or mixing. Alloying, or the formation of solid solutions, is, nonetheless, successful for thermoelectric materials, since the reduction in the lattice thermal conductivity is, generally, much greater than the reduction in the electrical conductivity. In terms of electrical performance alone, however, as exemplified by the thermoelectric power factor, $S^2\sigma$, the pure material, whether element or compound, is generally much better than the alloy or solid solution.

Optimizing the thermoelectric figure of merit of any material is a very intricate and elusive matter. Referring specifically to semiconductors, the two basic and most practical ways of doing so are achieved through doping with foreign impurities, as well as the formation of alloys or solid solutions. The only practical way to control the thermoelectric power, or Seebeck coefficient, S, is to alter the free charge carrier concentration. This implies modifying the doping level. Thus, increasing the doping level, brings about a reduction in the Seebeck coefficient, and vice versa. Quite the opposite is the situation with electrical conductivity. Increasing the doping level, increases the number of the free charge carriers, that is electrons or holes, and this increases the electrical conductivity. As far as thermal conductivity, or the flow of heat, is concerned, we have to realize that heat is conducted by both phonons and electrons. Therefore, thermal conductivity must be composed of two components: the lattice or phonon component, and the electronic component. As a matter of fact, the electronic contribution to the thermal conductivity is approximately proportional to the electrical conductivity. This proportionality, between electrical conduction, and thermal conduction, due to charge carriers, or electrons, is called the Wiedemann-Franz law. The factor of proportionality between the electronic component of the thermal conductivity, $k_{el}$, and the electrical conductivity, $\sigma$, is called the Lorenz number, L. This law is of great significance to theoretical solid state physicists. The bottom line here is that the aforementioned law, although originally derived or established for metals, is still applicable to semiconductors, or any other material for that matter. This applicability is valid, or accurate, as long as the fact that the thermal conductivity of non-metallic materials is composed of an electronic component, plus a lattice or phonon component, is kept in mind. Thus, the total thermal conductivity of a semiconductor material may be expressed as:

$$k = k_{lattice} + k_{electronic} = k_{lattice} + \sigma LT$$

where T is the absolute or thermodynamic temperature, in kelvins.

Generally speaking, the Seebeck coefficient, and the lattice, or phonon, component of the thermal conductivity, decrease with increasing doping level, that is increasing the number of the free charge carriers. On the other hand, the electrical conductivity, and the electronic component of the thermal conductivity, increase with increasing doping level. Consequently, the optimum doping level, that is the one that maximizes the thermoelectric figure of merit, lies in the range from $10^9$ to $10^{20}$ carriers per $cm^3$.

When forming an alloy or solid solution between two, or more, semiconductors, elements or compounds, the following effects usually take place as a result of that: The Seebeck coefficient changes very little with alloy composition. This is particularly true for semiconductors, but certainly not for metals. Furthermore, owing to alloy scattering, both the electrical and thermal conductivities will generally be smaller than the simple linear average of those corresponding to the two, or more, components of the alloy. As a matter of fact, alloy scattering tends to affect thermal conductivity, especially the lattice component thereof, more drastically than electrical conductivity. In reality, the thermal conductivity that results from mixing two, or more, semiconductors together is determined solely by those components, or ingredients, having the greatest difference in atomic mass and atomic volume (covalent volume). Consequently, the thermal conductivity attains a certain minimum value at some intermediate composition, between x=0 and x=1, and is usually substantially lower than that corresponding to any one of them.

It is normally possible to determine the lattice thermal conductivity that results from the mixing or alloying of any two semiconductors together. This is based on a theory originally developed by P. G. Klemens in 1955, although it is more commonly known as the Callaway theory. When point defects scatter phonons, mainly in virtue of their mass difference, Professor Klemens derived the following equation for the resulting change in the lattice thermal conductivity:

$$k = \frac{K}{2\pi^2 \upsilon} \frac{\omega_0}{B} \tan^{-1}\frac{\omega_D}{\omega_o} = k_o \frac{\omega_o}{\omega_D} \tan^{-1}\frac{\omega_D}{\omega_o}$$

where k is the lattice thermal conductivity due to point defect scattering, $\omega_o$ is the phonon vibration angular frequency at which the mean free path for point defect scattering equals that for intrinsic scattering, $\omega_D$ is the phonon vibration Debye frequency=$k\theta_D/h$, K is the Boltzmann constant and $\upsilon$ is the velocity of sound, or phonon velocity. In the absence of point defects, that is for a pure, or unalloyed, semiconductor, one may define the intrinsic lattice thermal conductivity as follows:

$$k_{int} = k_o = \frac{K}{2\pi^2 \upsilon} \frac{\omega_D}{B}$$

where B is a constant. Thus one may finally write:

$$\frac{k}{k_o} = \frac{\omega_o}{\omega_D} \arctan\frac{\omega_D}{\omega_o}$$

In the extreme case of strong point defect scattering $$\arctan\frac{\omega_D}{\omega_o} = \frac{\pi}{2}$$

and therefore $$k = \frac{\pi}{2}k_o\frac{\omega_o}{\omega_D}$$

Based on the work of Callaway and Von Baeyer, Borshchevsky, Caillat and Fleurial were able to put the above theoretical results of P. G. Klemens into the following form, which is, generally, more useful for conducting practical calculations:

$$k_{alloy} = \frac{\tan^{-1}u}{u}k_{pure}$$

where $u = (3G\Gamma k_{pure})^{\frac{1}{2}}$ and $G = \frac{\pi^2\theta_D\delta^3}{3h\upsilon_s^2}$ where $\theta_D$ is the Debye temperature, $\delta^3$ is the average volume per atom in the crystal, $\upsilon_s$ is the average sound, or phonon, velocity, h is Planck's constant, u is an alloy scattering scaling parameter and $\Gamma$ is the alloy scattering parameter. The above equations apply to all types of alloys, or solid solutions, particularly those involving chemical, or intermetallic, compounds. The velocity of sound, $\upsilon_s$, is preferably obtained by direct measurement. The scattering parameter includes both a mass fluctuation term, $\Gamma_A^M$, and a volume fluctuation term, $\Gamma_A^V$, defined as follows:

$$\Gamma_A^M = \sum_i f_i^A\left[1 - \frac{M_i}{\overline{M_A}}\right]^2$$

$$\Gamma_A^V = \sum_i f_i^A\varepsilon_A\left[1 - \frac{r_i}{\overline{r_A}}\right]^2$$

where $$\overline{M_A} = \sum_i f_i^A M_i$$

$$\overline{r_A} = \sum_i f_i^A r_i$$

$f_i^A$=relative proportion of each atom on a particular site A
$\varepsilon_{A,B,C,D}$=adjustable strain parameters $\overline{M}$ = total average mass for the alloy $$= \sum_i p_i\overline{M_i}$$

$p_i$ = atomic proportion of the A atoms in the compound $$= \frac{a}{a+b+c+d}$$

where $A_aB_bC_cD_d$ is, for example, the constitutional chemical formula of a particular alloy or solution; A, B, C and D representing the individual elements. The total alloy scattering parameter is defined by $$\Gamma = \sum_i p_i\left[\left(\frac{\overline{M_i}}{\overline{M}}\right)\Gamma_i^M + \Gamma_i^V\right]$$

The above theoretical analysis serves to indicate that in order to minimize the lattice thermal conductivity, of an alloy, or solid solution, both the mass and volume fluctuations must be maximized. There is no way, however, to control these mass and volume fluctuations, independently of each other. They are both simultaneously determined by the nature of the elements selected to constitute the alloy, or solid solution, that we are dealing with, or trying to develop. Furthermore, the mass fluctuation, or mass difference, between the elements on the respective sites, is much more influential in reducing the lattice thermal conductivity, than the volume fluctuation, or volume difference. Besides, the mass fluctuation parameter can usually be more accurately calculated than the volume fluctuation parameter. This is due to the fact that precise values of the strain parameter $\varepsilon$ are needed, in order for the volume fluctuation parameter to be accurately determined. Since reliable data for the strain parameter $\varepsilon$ are generally unavailable, especially for novel materials, such as the alloys, or solid solutions, that constitute the embodiments of the present invention, experimental measurements need to be conducted on samples of these alloys or solid solutions. Moreover, an additional mechanism, namely, phonon-electron interaction, or phonon scattering by charge carriers, or electrons, can bring about further lowering of the lattice thermal conductivity. This additional scattering is very apparent, or pronounced, particularly in heavily doped n-type semiconducting materials, namely those having a free charge carrier concentration in the range from $1\times10^{19}$ to $5\times10^{20}$ carriers per cm$^3$.

In order to develop or select an ideal thermoelectric material, that is one having the highest possible thermoelectric figure of merit, the thermal conductivity should be minimized. In a thermoelectric power generating pair, or thermocouple, for example, a high thermal conductivity means that heat will be transferred, or short-circuited, directly from the hot junction to the cold junction, without being converted to electrical energy. In an earlier analysis in this specification, regarding the use of A. F. Ioffe's "Heavy Element Selection Criterion" to minimize the thermal conductivity of our prospective ideal thermoelectric material, the aforementioned minimization was achieved through the selection of either bismuth or lead to constitute that ideal thermoelectric material. Since the two elements have about the same atomic mass, that is 207.2 for Pb, versus 208.98 for Bi, both have an equal chance of being selected to constitute that composition of matter. On the one hand, Bi has a much lower thermal conductivity than Pb, while their melting points are about the same.

Since the material that is being developed is essentially a semiconductor, the second choice is silicon. Actually, silicon, along with germanium, are the most truly semiconducting elements of the entire periodic table. However, since silicon is also classified as a non-metal, or semimetal, this gives it an edge over germanium. This is substantiated by the fact that the electrical conductivity of silicon at 20° C. is $2.52\times10^{-6}$ (ohm cm)$^{-1}$ while that of germanium is $1.45\times10^{-2}$ (ohm cm)$^{-1}$. This favors silicon in preference to germanium.

Since the thermal conductivity of silicon is rather high, about 1.49 Wcm$^{-1}$K$^{-1}$, at room temperature, it must be reduced, or minimized, as much as possible. One manner to do this is to alloy silicon with, or more accurately, form a chemical compound between it and, magnesium. This leads to the formation of the compound: magnesium silicide, $Mg_2Si$, which has a thermal conductivity, at room temperature, of approximately 0.08 $Wcm^{-1}K^{-1}$. Thus, through reacting Mg with Si, one reduces the thermal conductivity of the latter by a factor of about 19, which is quite substantial, while not incurring any serious deterioration of the excellent semiconducting properties of silicon, especially its high thermoelectric power. Thus, one ends up with magnesium, Mg, as the third choice of elements.

The selected three elements, namely, either bismuth or lead, silicon and magnesium are the basic constituents of the composition of matter. One needs now to proceed one step further, and select a fourth element, in order to complete this invention. Since the major objective is to minimize the thermal conductivity, the fourth element is selected so as to bring about a substantial reduction in the thermal conductivity, due to its "alloy scattering" interaction with magnesium. For maximum effectiveness, that element should preferably be of the same electronic structure, that is, it must belong to the same group as magnesium. Therefore, one focuses one's attention on group IIA, which, besides magnesium, also includes beryllium, calcium, strontium, barium and radium. Applying once more, the "Heavy Element Selection Criterion", radium is selected, since it possesses the highest atomic mass of all the elements of group IIA, which is 226. Radium, nevertheless, must be ruled out, owing to its high radioactivity. That leaves only four elements to choose from, specifically beryllium, calcium, strontium and barium. Since barium has the highest atomic mass of all the foregoing four elements, barium is selected as the fourth and last element. This guarantees that the "alloy scattering", or rather the "mass and volume fluctuation scattering", interaction between Mg and Ba will be the maximum possible. This is conducive to the minimum, or lowest, possible lattice thermal conductivity for the prospective composition of matter.

Coming back to the first choice of the element to constitute the prospective composition of matter, either lead or bismuth would be selected. Since the "mass and volume fluctuation scattering" interaction between Si and either of Pb and Bi is about the same, the decisive criterion, or factor, is the similarity of the electronic structure between silicon and the other two elements. This works in favor of Pb, since both lead and silicon belong to the same column, or group, of the periodic table, that is group IVB, whereas bismuth belongs to group VB. It thus has an electronic structure that differs from that of silicon. Therefore bismuth is eliminated, or ruled out, and the first element selected is lead, Pb. Consequently, the composition of matter is definitively constituted by the four elements: lead, silicon, magnesium and barium. That is the basic embodiment of this invention. Looking at the Periodic Table of the Elements, it is seen that all four elements occupy the corners of a rectangle. As mentioned above, the lattice thermal conductivity of the composition of matter is being reduced through a double interaction, namely a "mass and volume fluctuation scattering" between the atoms of silicon and lead, and another "mass and volume fluctuation scattering" between the atoms of magnesium and barium. This double, or two-fold, "mass and volume fluctuation scattering" leads to a very substantial lowering of the lattice thermal conductivity, of the so-obtained composition of matter. This becomes clear by looking at the following table:

| Element | Mg | Ba | Si | Pb |
|---|---|---|---|---|
| Atomic Mass | 24.305 | 137.327 | 28.086 | 207.2 |
| Atomic Radius Å (covalent) | 1.36 | 1.98 | 1.11 | 1.47 |
| Atomic Volume $cm^3/mol = \frac{atomic\ mass}{density}$ | 13.97 | 38.21 | 12.05 | 18.27 |
| Electronegativity | 1.31 | 0.89 | 1.90 | 2.33 | from which it can be inferred that:
(1) There is a very strong mass fluctuation scattering between the atoms of Mg and those of Ba, as well as between the atoms of Si and those of Pb. This is due to the large differences in the atomic mass between Mg and Ba, as well as between Si and Pb.
(2) There will also be a certain amount of volume fluctuation scattering between the atoms of Mg and Ba, as well as between the atoms of Si and Pb. This is due to the differences in the atomic radius and the atomic volume between Mg and Ba, as well as between Si and Pb.
(3) Due to the prevailing electronegativity differences, Mg and Ba will tend to react chemically, and form compounds, with each of Si and Pb, respectively. Thus the composition of matter will be composed of an alloy, or solid solution, of intermetallic compounds, containing magnesium silicide, magnesium plumbide, barium silicide and barium plumbide.
(4) It is rather unlikely that Mg and Ba, as well as Si and Pb, will form chemical compounds, because of the markedly lower electronegativity differences between them, as compared with those between Mg and Si, and Mg and Pb, as well as between Ba and Si, and Ba and Pb.

Consequently, the so-produced composition of matter is defined by the following chemical constitutional formula:

$$Ba_{2r}Mg_{2(1-r)}Si_{1-x}Pb_x$$

It is apparent from the above formula that the composition of matter is essentially composed of magnesium silicide, $Mg_2Si$, wherein part of magnesium is replaced by barium, and part of silicon is replaced by lead. That is obviously done in order to substantially reduce, or minimize, the thermal conductivity of the composition of matter, specifically the lattice thermal conductivity thereof. The so-produced composition of matter should have the lowest, or minimum, lattice thermal conductivity possible. The total thermal conductivity is also expected to be minimized. On the other hand, the thermoelectric power factor, $S^2\sigma$, should be maximized. This can be achieved by carefully doping the composition of matter with the appropriate foreign atoms, or impurities, in the appropriate amounts. The doping agent, or impurity, may be composed of one, or more, element, or elements, and/or compounds thereof. Incorporating the doping agent, or impurity, in the composition of matter is generally carried out in such a way as to bring about a free charge carrier concentration in the range from $1\times10^{15}$ to $5\times10^{20}$ carriers $cm^{-3}$. The atomic, or molecular, proportion of the doping agent, or impurity, may be approximately in the range from $10^{-8}$ to $10^{-1}$. The aforementioned lower limits, regarding the free charge carrier concentration, and the atomic or molecular proportion of the doping agent, actually refer to the limiting case, when the composition of matter is essentially "undoped." In practice, however, the composition of matter may preferably have to be at least lightly to moderately doped, that is corresponding to a free charge carrier concentration of from $1\times10^{18}$ to $1\times10^{19}$ carriers cm$^{-3}$. This will generally lead to a significant increase in the electrical conductivity, hopefully, the thermoelectric power factor and, correspondingly, the thermoelectric figure of merit. Heavy doping may still have to be preferably implemented, should no serious deterioration of the thermoelectric power, or Seebeck coefficient, result therefrom. That means that the free charge carrier concentration may be maintained in the range from $1\times10^{19}$ to $5\times10^{20}$ carriers cm$^{-3}$. That would definitely lead to maximization of the thermoelectric power factor, $S^2\sigma$, which, coupled with the minimization of the thermal conductivity, set forth earlier in this specification, unequivocally brings about a maximization of the thermoelectric figure of merit. Thus the concentration of the free charge carriers, in the composition of matter, preferably varies from $1\times10^{18}$ to $5\times10^{20}$ carriers cm$^{-3}$, and the corresponding atomic, or molecular, proportion of the doping agent, or impurity, preferably varies from $10^{-5}$ to $10^{-1}$.

It should be noted that all of the foregoing analysis refers to the thermoelectric performance and properties, of the composition of matter, when it is subjected to relatively low temperatures, i.e. not higher than about room temperature. It should also be emphasized that the composition of matter will tend to be n-type at low temperatures, even without doping. As the temperature of the material increases, the concentration of the charge carriers will tend to increase, due to thermal activation, and the n-type characteristic becomes more pronounced. For undoped samples of Mg$_2$Si, for example, prepared by a powder metallurgy technique, involving cold uniaxial pressing and then sintering, with no exposure to atmospheric oxygen, the thermoelectric power and thermoelectric power factor were found to increase substantially as the temperature went up, from about 300K, reaching a maximum value or plateau, at approximately 800K. The samples were found to be n-type. This indicates that doping is probably not needed at all in the preparation, or production, of n-type thermoelements, or branches, of thermoelectric devices, constituted by the aforementioned composition of matter. N-type doping of the composition of matter remains optional, to be implemented only if necessary. The foregoing is especially true for operating temperatures considerably higher than room temperature.

The same is not true when the composition of matter is used to constitute the p-type branch, or thermoelement, of a thermoelectric energy conversion device. Doping with an acceptor, or p-type, impurity, or doping agent, will definitely be needed for the production of such a p-type material. The way to do this is clearly set forth in the corresponding embodiments of this invention, earlier in this specification, as well as the preceding few paragraphs. Now producing a p-type thermoelectric material is, generally, more difficult, than producing an n-type one. This is especially true for materials composed of several elements, of widely differing atomic masses and atomic volumes, such as the magnesium-barium silicide plumbide alloy, or solid solution, we are dealing with, and which constitutes the fundamental embodiment of this invention. They all tend to be n-type, and this tendency becomes more, and more, pronounced, that is it gets stronger and stronger, as the temperature increases, and goes well above room temperature. Moreover, the thermoelectric performance of p-type materials, usually, tends to be inferior to that of n-type ones. This is due to the fact that the mobility of holes is generally less than that of electrons. Careful attention to the process, or method, of doping may help alleviate both problems. This situation may be further improved, if the p-type composition of matter is not at all used for power generation purposes, but rather in devices intended for thermoelectric heat pumping and thermoelectric refrigeration, where operating temperatures are much lower. In thermoelectric power generating devices, paying extra attention to the technique, or method, of doping, such as the kind of doping material, and the doping level, to be used, along with the use of the FGM, or functionally graded material, technique, as described earlier in a couple of embodiments in this specification, could help improve the situation. Should there still be problems with the p-type composition of matter, with regard to either its thermoelectric performance, or the possibility of producing it, and maintaining its p-type characteristics, particularly at high temperatures, then replacing the p-type composition of matter by a passive Goldsmid branch, constituted by a high critical temperature superconductor, maybe advisable. In such a case, the composition of matter, as defined in this specification, may be used in the manufacture of only the n-type branch, or thermoelement, of devices for direct thermoelectric energy conversion. Thus, in a prospective ideal thermoelectric device, comprising an n-type branch, or thermoelement, constituted by the composition of matter, and a passive Goldsmid branch, or thermoelement, replacing the p-type branch, the overall performance of the device is absolutely determined by the performance of the n-type branch. In fact, the passive branch merely serves to complete, or close, the electric circuit. It does not contribute to any increase or decrease whatsoever of the thermoelectric performance, or energy conversion efficiency, of the device. It does so indirectly, however, since it helps us to avoid using an, otherwise, badly performing p-type branch, which would be conducive to a certain deterioration of the thermoelectric performance and energy conversion efficiency.

An alternative embodiment of this invention is again based on the compound: magnesium silicide, Mg$_2$Si, with the only difference that part of magnesium is replaced by at least one element, selected from a group of four elements, comprising beryllium, calcium, strontium and barium, and that part of silicon is replaced by at least one element, selected from a group of seven elements, comprising germanium, tin, lead, antimony, bismuth, selenium and tellurium. The so produced alternative composition of matter, therefore, has the following chemical constitutional formula:

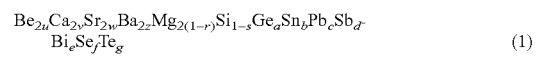

$$Be_{2u}Ca_{2v}Sr_{2w}Ba_{2z}Mg_{2(1-r)}Si_{1-s}Ge_aSn_bPb_cSb_d\text{-}Bi_eSe_fTe_g \quad (1)$$

It should be emphasized that the fundamental, or central, embodiment of this invention, as defined by the formula:

$$Ba_{2r}Mg_{2(1-r)}Si_{1-x}Pb_x \quad (2)$$

is only a special case of the aforementioned, more general, broader-scope, constitutional formula No. (1), by merely setting each of u, v, w, a, b, d, e, f and g equal to zero. Comparing the above two constitutional formulas, the following observations are noteworthy:

(1) Alloys, or solid solutions, prepared according to the basic embodiment, or formula No. (2), will have the absolute minimum, or lowest possible, thermal conductivity, specifically the lattice component thereof.

(2) Alloys, or solid solutions, prepared according to the alternative embodiment, or formula No. (1), will tend to have higher thermal conductivity than those prepared according to formula No. (2). Formula No. (1), however, maybe conducive to alternative composition of matter, having higher average energy band gaps, and melting temperatures, which could prove worthwhile in high temperature applications.

(3) Regardless of the statements made in item (2) above, both barium and lead should still be present, even in smaller amount, or proportion, in the compositions of matter, in order not to deviate too much from, or go much higher than, the minimum lattice thermal conductivity.

(4) Bismuth may still be used as a partial substitute, or replacement, for silicon, according to formula No. (1) above. However, it may not be as effective as lead in lowering the lattice thermal conductivity, of the resulting composition of matter, to the absolute minimum. This is due to the fact that it is not as compatible with silicon, as lead, and that is because bismuth and silicon have different electronic structures, since they belong to different groups in the periodic table. Bismuth could, nevertheless, contribute to improving the thermoelectric power factor of the composition of matter. Then bismuth may be used as a partial substitute for silicon, preferably not alone by itself, but in combination with lead. That is preferable, in order not to deviate at all from the minimum lattice thermal conductivity.

(5) The constitutional formula No. (1) above, representing the alternative, broader-scope, embodiment of this invention, does not specify that the atomic proportion of any of the elements, other than barium and lead, that replace part of magnesium, or part of silicon, cannot be zero. This provides the broadest possible coverage, or scope, for the alternative embodiment.

(6) Regardless of all the foregoing analysis, the constitutional formula No. (2) above still represents the fundamental, or central, embodiment of this invention.

The following criteria, or principles, for obtaining good thermoelectric materials, with a high figure of merit, and a high energy conversion efficiency, have been established by A. F. Ioffe in 1957, for a standard band-type semiconductor:

(1) The ratio of the charge carrier mobility to the lattice thermal conductivity must be maximized. Since the mobility of electrons and holes tends to always deteriorate when several compounds are mixed together to form an alloy, or solid solution, when the material is not a single crystal, and when the temperature is well above room temperature, the only way to achieve this is to drastically reduce the lattice thermal conductivity.

(2) The forbidden energy band gap $E_g$ must be greater than $4k_B T_{int}$ where $k_B$ is the Boltzmann constant and $T_{int}$ is the intrinsic or maximum hot junction operating temperature expressed in kelvins. Assuming $T_{int}$ to be 800° C., or 1073K, that gives us $E_g$=0.37 eV (electron volts).

(3) The semiconductor must be dopable to the extrinsic regime.

The above criteria were further elaborated by Pierre Aigrain, who eventually put them in the following definitive, more practical, form: Good thermoelectric engines (power generating devices), for close to room temperature cold source (unction) operation, should make use of materials having the following properties:

(1) Operating hot source (unction) temperature around 700–800° C.
(2) Solid solutions.
(3) If possible, anisotropic materials.
(4) Energy band gap, $E_g$, of the order of 0.6 eV.

Bearing in mind that the energy band gap of $Mg_2Si$ is about 0.78 eV, then for an alloy, or solid solution, prepared, for example, according to the following constitutional formula:

$$Ba_{0.4}Mg_{1.6}Si_{0.85}Pb_{0.15}$$

an average energy band gap may be approximately calculated, assuming a linear relationship between the energy band gaps of the respective compounds, and their atomic or molecular proportions. This was done, and the average energy band gap for such an alloy was found to be about 0.63 eV. This shows that the composition of matter, related to the basic embodiment of this invention, substantially satisfies Pierre Aigrain's criterion No. (4), requiring an energy band gap of about 0.6 eV. Criteria Nos. (1) and (2) are also fundamentally satisfied by both the basic, as well as the alternative, wider-scope and more general, embodiment of this invention. Criterion No. (3) can be satisfied only if the material is a single crystal, since single crystals are known to be anisotropic. Full advantage of any anisotropy should be taken of, if the composition of matter is produced as a single crystal.

To conclude, it should be highlighted that the main thrust and objective of this invention is the development or production of a composition of matter, or material, with substantially reduced, or extremely low, lattice thermal conductivity. This is accomplished as follows:

(1) The selection of silicon as one of the basic ingredients of the composition of matter. Therefore, silicon becomes our first element.

(2) Reacting silicon chemically with magnesium to form the compound magnesium silicide, $Mg_2Si$. Thus, magnesium is the second ingredient.

(3) Substituting part of silicon with lead. Therefore, lead is the third constituent.

(4) Substituting part of magnesium with barium. Thus barium is the fourth element.

Each of the above four steps, leads to a considerable reduction in the lattice thermal conductivity of the resulting compound, alloy or solid solution. This, of course, is conducive to the composition of matter, representing the basic embodiment of this invention, defined by the constitutional formula:

$$Ba_{2r}Mg_{2(1-r)}Si_{1-x}Pb_x$$

and having an extremely low lattice thermal conductivity. The lattice thermal conductivity is not going to be exactly equal to zero, but should be very nearly so. This has been the central goal of this invention.

Furthermore, the thermoelectric power factor, PF, of the composition of matter is, simultaneously, expected to be very high. This is based on the following facts:

(1) The thermoelectric power of an undoped, n-type, magnesium silicide, $Mg_2Si$, sample, prepared by a powder metallurgy technique, involving cold pressing in a platinum cylinder, and then sintering in an argon gas atmosphere, at a temperature in the range from 1073K to 1200K, has been experimentally measured and found to be nearly 230 $\mu VK^{-1}$ at about 330K and rising to about 1000 $\mu VK^{-1}$, in the temperature range from 700K to 800K. The maximum value was found to occur at 760K. The experimentally measured power factor, for the same sample, was found to vary from $0.3 \times 10^{-3}$ $Wm^{-1}K^{-2}$, at nearly 330K, to a maximum value of about $5.4 \times 10^{-3}$ $Wm^{-1}K^{-2}$ at 760K.

(2) Consequently, the thermoelectric figure of merit of the magnesium silicide sample, prepared as indicated above, is reasonably high. Its value, at the higher temperature of 760K, can be calculated on the basis of the known value of its thermal conductivity, which is about 0.08 Wcm$^{-1}$K$^{-1}$, which yields a thermoelectric figure of merit of $5.4 \times 10^{-3} \times 10^{-2}/0.08 = 6.75 \times 10^{-4}$K$^{-1}$.

(3) The fundamental embodiment of this invention comprising a composition of matter defined by:

$$Ba_{2r}Mg_{2(1-r)}Si_{1-x}Pb_x$$

should have a thermoelectric power about the same as, or even higher than, that of magnesium silicide, Mg$_2$Si, alone. This is substantiated by the fact that barium silicide, or rather barium disilicide BaSi$_2$, one of the ingredients of the composition of matter, with an energy band gap $E_g=0.48$ eV, is known to have a thermoelectric power S=600 μVK$^{-1}$ at room temperature. This is much higher than that of pure Mg$_2$Si at the same temperature. Thus the relatively higher values of the thermoelectric power of the aforementioned compound, BaSi$_2$ should be conducive to a noteworthy increase in the overall thermoelectric power of the composition of matter. This is further corroborated by the fact that semiconductors, for which the valence and/or conduction bands are dominated by d-band character, may be able to combine the high Seebeck, or thermoelectric power, values, typical of transition metal alloys, with the ability to achieve optimum doping levels, typical of conventional thermoelectric materials. Certain metal-silicon compounds appear to have this desirable combination of properties, and barium silicide, BaSi$_2$, definitely is one of them (more exactly, barium disilicide).

(4) The electrical conductivity of the composition of matter, prepared as indicated in item (1) above, in relation to magnesium silicide, Mg$_2$Si, could be increased through light, moderate or heavy, doping, using the appropriate foreign atom, or atoms, as the doping agent. Doping, however, should be exercised with utmost care, making sure that the thermoelectric power, S, does not, consequently, deteriorate, or becomes adversely affected, as the temperature increases to well above room temperature.

(5) The thermoelectric power factor may still be further increased, by preparing the composition of matter according to the alternative, broader-scope, constitutional formula:

$$Be_{2u}Ca_{2v}Sr_{2w}Ba_{2z}Mg_{2(1-r)}Si_{1-s}Ge_aSn_bPb_cSb_d\text{-}Bi_eSe_fTe_g$$

wherein Ba and Pb are still present in quite substantial atomic proportions, say not less than about 80% of the appropriate, or required, stoichiometric amounts, and wherein part of Ba and/or part of Pb are replaced by one, or more, elements, selected as indicated in the constitutional formula. This could lead to a certain increase in the thermoelectric power, thermoelectric power factor, average energy band gap and average melting temperature of the resulting composition of matter. A substantial reduction in the atomic proportions of Ba and/or Pb in the composition of matter, however, will definitely bring about a corresponding increase in the lattice thermal conductivity. This should be absolutely avoided, if at all possible. Therefore, any eventual substitution of Ba and/or Pb, even a partial one, by another element, or elements, must be reduced to the absolute minimum, in order not to adversely affect the lattice thermal conductivity. The ideal situation would be to absolutely avoid all kinds of replacement of either element, that is barium and lead, which would yield, or assure, the absolute minimum lattice thermal conductivity, as well as the absolute minimum total thermal conductivity. That is why the magnesium-silicon-lead-barium alloy, or solid solution, constitutes the cornerstone, or central, embodiment of this invention.

The thermoelectric figure of merit of the aforementioned composition of matter:

$$Z = \frac{S^2\sigma}{k} = \frac{S^2}{\rho k} = \frac{PF}{k}$$

may be calculated based on the following:

(1) The composition of matter, prepared according to the basic constitutional formula:

$$Ba_{2r}Mg_{2(1-r)}Si_{1-x}Pb_x$$

wherein r varies from 0.1 to 0.4, and x varies from 0.1 to 0.3, should have a minimum total thermal conductivity $$k=k_{total}=0.002 \text{ Wcm}^{-1}\text{K}^{-1}$$

approximately at room temperature. This may be assumed as nearly equal to the minimum lattice thermal conductivity.

(2) Since the composition of matter, as defined by the above basic formula, is substantially constituted by magnesium silicide, Mg$_2$Si, we will assume that it has the same thermoelectric power, and power factor, as magnesium silicide. The experimentally measured power factor for Mg$_2$Si was found to be:

$$PF=S^2\sigma=5.4\times10^{-3}\text{Wm}^{-1}\text{K}^{-2}$$

at 760K. Therefore, the thermoelectric figure of merit is:

$$Z = \frac{5.4 \times 10^{-3}}{0.002 \times 10^2} = 2.7 \times 10^{-2} K^{-1}$$

and the dimensionless thermoelectric figure of merit becomes:

$$ZT=2.7\times10^{-2}\times760=20.52$$

Since the best thermoelectric materials known or used today, like Si$_{0.7}$Ge$_{0.3}$, Mg$_2$Si$_x$Sn$_{1-x}$ and others, have not been able to very much exceed ZT=1, the above value for ZT, for the composition of matter, represents a breakthrough in thermoelectrics.

The present analysis wouldn't be complete without calculating the thermoelectric energy conversion efficiency of a device comprising the aforementioned composition of matter. The following equation, which is well known in the art, may be used for computing the efficiency:

$$\eta = (1-a)\frac{\sqrt{1+M}-1}{\sqrt{1+M}+a} \qquad (1)$$

where:

$$a = \frac{T_c}{T_h} = \frac{\text{cold source, or junction, temperature}}{\text{hot source, or junction, temperature}} \qquad (2)$$

-continued $$M = \frac{S^2\sigma}{k}T_h\left(\frac{1}{2} + \frac{a}{2}\right) = ZT_h\frac{1}{2}\left(1 + \frac{T_c}{T_h}\right) \quad (3)$$

and where $S^2\sigma$ depends on the electronic properties and k depends, almost entirely, if one neglects the electronic heat conductivity on the lattice properties. Substituting equations (2) and (3) into equation (1), and working out the mathematics, one arrives at the following result:

$$\eta = \left(\frac{T_h - T_c}{T_h}\right)\left[\frac{\sqrt{1 + Z\left(\frac{T_h + T_c}{2}\right)} - 1}{\sqrt{1 + Z\left(\frac{T_h + T_c}{2}\right)} + \frac{T_c}{T_h}}\right] \quad (4)$$

For the limiting case, when $T_c$ approaches $T_h$, we have $$\lim_{T_c \to T_h} \frac{T_c}{T_h} = 1 \text{ and} \quad (5)$$

$$\lim_{T_c \to T_h} \frac{T_h + T_c}{2} = T_h \quad (6)$$

and thus obtain:

$$\eta = \left(\frac{T_h - T_c}{T_h}\right)\left[\frac{\sqrt{1 + ZT_h} - 1}{\sqrt{1 + ZT_h} + 1}\right] \quad (7)$$

The first term between the parentheses on the right hand side of equation (7) is the energy conversion efficiency of an ideal heat engine, operating between a maximum temperature, $T_h$, and a minimum temperature, $T_c$, according to the second law of thermodynamics. This is also known in the art as the Carnot efficiency. Assuming a thermoelectric energy conversion device, namely a power generator, operating between a hot junction temperature of 800K and a cold junction temperature of 300K, comprising a material having a figure of merit $Z=2.7\times10^{-2}K^{-1}$, and assuming that the foregoing value of Z holds at 800K, instead of 760K, which is nearly correct, we obtain:

$$\eta = \left(\frac{800 - 300}{800}\right)\left[\frac{\sqrt{1 + 2.7 \times 10^{-2} \times 800} - 1}{\sqrt{1 + 2.7 \times 10^{-2} \times 800} + 1}\right]$$

$$= 0.625 \times 0.6524 = 0.408$$

The above figure for the energy conversion efficiency favorably compares with that of the best conventional power plants in use today, including well designed boilers, steam and gas turbines, as well as Diesel engines. This figure for the energy conversion efficiency will be more accurately calculated, if we substitute the average temperature between the hot and cold junctions, that is 500K, instead of 800K, in the foregoing equation. Thus the more exact calculation, using equation (4), yields:

$$\eta = 0.625\left[\frac{\sqrt{1 + 2.7 \times 10^{-2} \times 550} - 1}{\sqrt{1 + 2.7 \times 10^{-2} \times 550} + \frac{300}{800}}\right]$$

$$= 0.625\left[\frac{\sqrt{1 + 14.85} - 1}{\sqrt{1 + 14.85} + 0.375}\right]$$

$$= 0.625\left[\frac{3.9812 - 1}{3.9812 + 0.375}\right] = 0.625 \times \frac{2.9812}{4.3562} = 0.428$$

That is a higher energy conversion efficiency still than the earlier value of 0.408.

Summarizing, the embodiments of the present invention are as follows:

The fundamental embodiment of this invention is a composition of matter comprising magnesium, silicon, lead and barium. The composition of matter may be used in the manufacture of the p-type and/or n-type thermoelements or branches of devices for direct thermoelectric energy conversion, comprising a positive branch, a negative branch, a hot junction and a cold junction. Because each of magnesium and barium react chemically, and form compounds, with each of silicon and lead, respectively, the composition of matter may be regarded as an alloy, or solid solution, of intermetallic compounds, containing magnesium silicide, magnesium plumbide, barium silicide and barium plumbide. Since the alloy, or solid solution, contains substantial atomic proportions of both magnesium and silicon, in the stoichiometric ratio of 2:1, the composition of matter may be considered essentially consisting of magnesium silicide, $Mg_2Si_{1-s}$ wherein part of magnesium is replaced by barium, and part of silicon is replaced by lead. The composition of matter is thus defined by the following constitutional formula:

$$Ba_{2r}Mg_{2(1-r)}Si_{1-x}Pb_x$$

The alternative, or broader scope, embodiment of this invention is essentially based on the above constitutional formula, but differs from it in that part of magnesium is replaced by one or more elements, selected from the group consisting of beryllium, calcium, strontium and barium, and that part of silicon is replaced by one or more elements, selected from the group comprising germanium, tin, lead, antimony, bismuth, selenium and tellurium, wherein the resulting composition of matter is defined by the following constitutional formula:

$$Be_{2u}Ca_{2v}Sr_{2w}Ba_{2z}Mg_{2(1-r)}Si_{1-s}Ge_aSn_bPb_cSb_d\text{-}Bi_eSe_fTe_g$$

where $r=u+v+w+z$ and $s=a+b+c+d+e+f+g$.

The composition of matter, whether defined by the basic constitutional formula, comprising only four elements, or the alternative, broader-scope, constitutional formula, comprising 13 elements, may be used in the undoped state, that is without the incorporation of any doping agent or impurity. It may, however, still be doped, if necessary. That means that the addition of a doping material, or impurity, to the composition of matter is only optional, to be carried out only when required. Doping is a very delicate and intricate matter, and should therefore be exercised with utmost caution. This is absolutely necessary, if the thermoelectric properties and performance of the composition of matter are to be optimized. All of the foregoing statements obviously refer to n-type doping. Generally speaking, semiconductors, especially when used as thermoelectric materials, are usually doped, in order to maximize the thermoelectric figure of merit. The present composition of matter, being a semiconductor, is thus no exception. However, recent experimental work, carried out on a magnesium silicide, $Mg_2Si$, specimen, prepared by a powder metallurgy technique, has yielded an extremely high power factor, that is $5.4 \times 10^{-3}$ $Wm^{-1}K^{-2}$, which, when extrapolated, or applied, to the composition of matter, and combined with its very low total thermal conductivity, namely $0.002$ $Wcm^{-1}K^{-1}$, gives a thermoelectric figure of merit $Z=2.7 \times 10^{-2}K^{-1}$, and a dimensionless figure of merit $ZT=20.5$ at a temperature of 760K. The sample was n-type and undoped, which makes the aforementioned results for Z and ZT all the more extraordinary.

The main point is that these singular results are, or can be, achieved without any doping whatsoever. Nonetheless, because we are dealing here with an entirely new composition of matter, namely the magnesium-silicon-lead-barium alloy, or solid solution, we cannot be absolutely sure whether doping will, or won't, be required. The composition of matter may still need to be lightly, or moderately doped. The aforementioned experimental evidence, regarding pure magnesium silicide, however, is conducive to the preliminary conclusion that n-type doping probably will not be required, particularly for high temperature applications. Any definitive conclusion in this respect must be based on concrete experimental evidence related to the composition of matter itself. Regardless of the method of preparation, or production, the composition of matter will always tend to be n-type, even if it is undoped. Furthermore, this tendency towards n-type behavior becomes even more and more pronounced, as the temperature gets higher and higher, to well above room temperature. That again corroborates the preliminary, or initial, conclusion that n-type doping will probably not be required for the composition of matter, particularly in those applications where the operating temperature is relatively high. Production, or preparation, of a composition of matter, that is p-type, nonetheless requires doping with a p-type foreign atom, or impurity, that is normally classified as an acceptor. In such a case, heavy doping with a p-type doping element, or elements, and/or compounds thereof, is required or recommended. Because of the already demonstrated tendency of the composition of matter towards n-type behavior, even without any doping whatsoever, preparation of a p-type material will, generally, be more difficult than an n-type one. That is why heavy doping is indispensable, for obtaining a p-type composition of matter. That becomes all the more significant, in order to also prevent the p-type material from switching to n-type behavior, as the temperature goes up to well above its room temperature level of 298K.

For the foregoing reasons, as well as to assure a more effective doping, in general, the doping element is preferably selected from the group lying to the left of that containing Be, Mg, Ca, Sr and Ba, that is group IA. Thus, the elements to be selected as the preferred p-type doping materials, or agents, are lithium, sodium, potassium, rubidium, cesium and francium. Lithium is ruled out as an acceptor, or p-type doping agent, because it actually exhibits n-type characteristics, that is it behaves, or acts, as a donor. The foregoing situation is explained by the fact that the atoms of lithium due to their relatively smaller size, go in between the host atoms of the composition of matter interstitially, rather than substitutionally. Likewise, francium is unacceptable, because it is both unstable and radioactive. Thus the four elements to choose from as the most effective, and most recommended, p-type doping materials, or acceptor impurities, for the composition of matter are sodium, potassium, rubidium and cesium. Due to the fact that the elements are highly electropositive, a violent, or harsh, chemical reaction is to be expected upon their introduction into the host material or the composition of matter. If that is inconvenient, then these elements, that is Na, K, Rb and/or Cs, may be reacted, or made to form compounds, with another element, or elements, preferably silicon and/or lead. In such a case, one or more of these elements may act as partial substitutes, or replacements, for magnesium and/or barium. The chemical constitutional formula for the resulting composition of matter will then be:

$$Na_{2u}K_{2v}Rb_{2w}Cs_{2y}Ba_{2z}Mg_{2(1-r)}Si_{1-x}Pb_x$$

wherein $r=u+v+w+y+z$ represents the sum of the atomic proportions of the elements that replace part of magnesium, wherein r varies from 0.1 to 0.4, wherein (u+v+w+y) varies from $10^{-8}$ to $10^{-1}$, wherein each of u, v, w and y varies from 0 to 0.1, wherein z is not less than 0.1, and wherein x varies from 0.1 to 0.3. The aforementioned p-type doping elements, namely Na, K, Rb and Cs, are supposed to form chemical compounds with Si and/or Pb, in the correct stoichiometric ratio of 2:1. The four doping elements must, specifically, form compounds such as $Na_2Si$, $K_2Si$, $Rb_2Si$ and $Cs_2Si$, in order for the foregoing constitutional formula to be correct. The actual compounds that will naturally form, however, will be NaSi, KSi, etc. Therefore, a mixture should be produced between the natural compound NaSi, for example, and Na, so that the end product will be equivalent to $Na_2Si$. For example, assuming that only Na replaces Mg in the compound magnesium silicide, $Mg_2Si$, one writes:

$$rNaSi+rNa+(1-r)Mg_2Si=Na_{2r}Mg_{2(1-r)}Si$$

and with the alloy or solid solution:

$$Mg_2Si_{1-x}Pb_x$$

one writes:

$$r(NaSi)_{1-x}+rNa_{1-x}+(1-r)Mg_2Si_{1-x}+r(NaPb)_x+rNa_x+ (1-r)Mg_2Pb_x=Na_{2r}Mg_{2(1-r)}Si_{(1-x)}Pb_x$$

That gives a general idea, or clue, on how to proceed with the doping for any other doping element. A similar approach is also applicable to the elements, or rather compounds, to be used for n-type doping. Consequently, doping with one, or more, of the elements Na, K, Rb and/or Cs, either in their pure elemental forms, or as compounds with another element or elements, preferably with Si and/or Pb, as indicated above, will ensure a much more powerful and effective p-type doping, than any of the elements belonging to the groups from IIIA to IIIb in the periodic table of the elements. Some of these elements are known as p-type, or acceptor, dopants, some are donors, and many still are unpredictable, for lack of experimental evidence, and it would be better to stay away from these. Confirmed p-type doping elements, in the aforementioned region of the periodic table, for example, are only Cu and Ag. Other elements, such as Fe, Al, Ga and In, are n-type doping agents. Boron, B, is ambivalent, it works sometimes as a donor and sometimes as an acceptor, depending on the level of doping or the charge carrier concentration. It was found suitable for controlling the concentration of p-type charge carriers. It generally gives higher p-type charge carrier concentration. Boron may thus be used to increase the effectiveness of p-type doping, either alone by itself, or in combination with other dopants.

Preparing a composition of matter that is n-type requires one of the following three approaches: the material may be lightly doped, or moderately doped, or simply used the way it is, without any doping whatsoever, that is entirely undoped. Heavy n-type doping is, therefore, ruled out, because the composition of matter exhibits n-type behavior and characteristics, even in the undoped state. In general, should n-type doping be required, or necessary, then this can be accomplished through the incorporation, or introduction, into the composition of matter of a foreign atom, that is normally classified as a donor, or n-type dopant. In order to bring about a more powerful, and effective doping, in general, the doping agent, or material, preferably comprises one, or more, elements, selected from the groups lying to the right of that containing Si and Pb that is groups VB, VIB and VIIB of the periodic table of the elements. Therefore, the elements to be used as n-type doping materials, or agents, preferably are nitrogen, phosphorus, arsenic, antimony, bismuth, oxygen, sulfur, selenium, tellurium, polonium, fluorine, chlorine, bromine, iodine and astatine. Now polonium and astatine are ruled out, for being radioactive. Fluorine is as well eliminated, for being highly reactive, since it is the most electronegative element of the periodic table. Thus, there is a list of twelve elements to choose from, as the most effective and most recommended n-type doping materials, or donor impurities, for the composition of matter. Thus, the preferred n-type doping material, or materials, comprises one, or more, elements, selected from the group consisting of nitrogen, phosphorus, arsenic, antimony, bismuth, oxygen, sulfur, selenium, tellurium, chlorine, bromine and iodine. These elements may be used either in their pure elemental form, except nitrogen, oxygen and chlorine, which are gaseous, or as compounds with another element or elements, preferably with Mg and/or Ba. If the n-type doping materials, or dopants, are introduced as compounds with Mg and/or Ba, then the chemical constitutional formula of the resulting composition of matter will be:

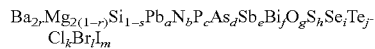
$$Ba_{2r}Mg_{2(1-r)}Si_{1-s}Pb_aN_bP_cAs_dSb_eBi_fO_gS_hSe_iTe_jCl_kBr_lI_m$$

Since reacting the gaseous elements, nitrogen, oxygen and chlorine, to form compounds with magnesium and/or barium, is a much involved and complex chemical process, those three elements may be eliminated from the list of doping materials, and one thus ends up with the following simpler, and more practical, constitutional formula:

$$Ba_{2r}Mg_{2(1-r)}Si_{1-s}Pb_aP_bAs_cSb_dBi_eS_fSe_gTe_hBr_iI_j$$

wherein $s=a+b+c+d+e+f+g+h+i+j$ represents the sum of the atomic proportions of the elements that replace part of silicon, wherein s varies from 0.1 to 0.3, wherein $(b+c+d+e+f+g+h+i+j)$ varies from $10^{-8}$ to $10^{-1}$, wherein each of b, c, d, e, f, g, h, i and j varies from 0 to 0.1, wherein a is not less than 0.1 and wherein r varies from 0.1 to 0.4.

All the foregoing analysis as to how to produce mixtures of the actual compounds, and the elements themselves, so that the correct stoichiometric ratio of 2:1, in relation to p-type doping, will be maintained, are also equally applicable here, namely in relation to n-type doping. Doping according to the above constitutional formula will ensure a more effective n-type doping, than using any of the elements belonging to the groups from IIIA to IIIB, in the periodic table. Of these elements, the only ones that are experimentally confirmed as n-type doping agents are Au, Al, In and Fe. Thus, the aforementioned constitutional formula, comprising nine doping elements, that is phosphorus, arsenic, antimony, bismuth, sulfur, selenium, tellurium, bromine and iodine, provides the basis for a more effective and powerful n-type doping, than the individual elements: Au, Al, In and Fe, used as pure elements only. However, combinations of dopants, composed of simple elements and/or compounds of these, or other elements, preferably with Mg and/or Ba, may well be used, and there are no restrictions, or limitations, on that.

The composition of matter may, nonetheless, be doped by bringing about an excess of magnesium, silicon, lead or barium therein, above the quantity, or amount, required by stoichiometry. In principle, and excess of Mg or Ba effects an n-type material, that is n-type doping, whereas an excess of Si or Pb creates a p-type material, namely p-type doping. Thus, doping can generally be achieved by producing either an excess, or a deficiency, of any of the four basic constituents: Mg, Si, Pb or Ba, or through the introduction of a foreign atom, or element. Doping with a foreign element is preferred, as this enables one to exert a better control over the concentration of the free charge carriers, as well as over the type of electrical conductivity, p-type or n-type, to be effected in the composition of matter. The amount of doping agent, or impurity, to be incorporated into the composition of matter, as indicated earlier, should be so adjusted as to bring about a free charge carrier concentration, preferably in the range from $1\times10^{15}$ to $5\times10^{20}$ carriers per $cm^3$. The doping element, or agent, may be introduced either in its pure elemental form, or as a compound with Mg and/or Ba, or as a compound with Si and/or Pb, depending on whether the doping is n-type or p-type. Alternatively, for better results, more than one doping element, or compound, may be used. This applies to both n-type and p-type doping, and becomes all the more significant, since the composition of matter is basically composed of four elements of widely varying atomic masses, atomic volumes, electronegativities and electronic structures. Thus, the ideal chemical constitutional formula, related to p-type and/or n-type doping, in general, is the one that combines the foregoing definitive formulas, corresponding to p-type and n-type doping. The overall doping constitutional formula is thus written as follows:

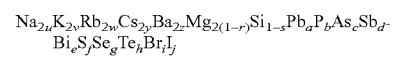
$$Na_{2u}K_{2v}Rb_{2w}Cs_{2y}Ba_{2z}Mg_{2(1-r)}Si_{1-s}Pb_aP_bAs_cSb_dBi_eS_fSe_gTe_hBr_iI_j$$

wherein the subscripts represent the atomic proportions of the relevant elements, wherein $r=u+v+w+y+z$ varies from 0.1 to 0.4, wherein $(u+v+w+y)$ varies from $10^{-8}$ to $10^{-1}$, wherein each of u, v, w and y varies from 0 to 0.1, wherein z is not less than 0.1, wherein $s=a+b+c+d+e+f+g+h+i+j$ varies from 0.1 to 0.3, wherein $(b+c+d+e+f+g+h+i+j)$ from $10^{-8}$ to $10^{-1}$, wherein each of b, c, d, e, f, g, h, i and j varies from 0 to 0.1, and wherein a is not less than 0.1. The aforementioned constitutional formula defines the entire spectrum of p-type and n-type doping, specifically when the doping element, or elements, is/are introduced as compounds with one, or more, of the basic constituents Mg, Si, Pb and Ba. The type of electrical conductivity to be eventually brought about, using the broad-spectrum constitutional formula, whether p-type or n-type, is determined on the basis of the relative proportions of the doping elements lying to the left of Ba and those lying to the right of Pb. Furthermore, it should be emphasized that both Ba and Pb are not to be regarded as doping elements. On the contrary, they are basic constituents of the composition of matter.

The composition of matter may be a single crystal, or polycrystalline. A single crystal material will tend to have a higher mobility of the electrons, due to the absence of grain boundaries, and, consequently, a higher electrical conductivity. An undoped n-type polycrystalline material or sample, prepared by a powder metallurgy technique, involving uniaxial cold pressing, under a pressure of about 10 MPa, and then sintering at 1073K to 1200K, in an argon gas atmosphere, will have a very high thermoelectric power, and a very high thermoelectric power factor. Actually, its measured thermoelectric power factor was found to be ten times higher than that of another sample, prepared by a melt metallurgy technique. The aforementioned data refer to pure magnesium silicide, $Mg_2Si$, samples. The data may be safely extended, however, to the composition of matter, herein described, since it is substantially composed of magnesium suicide. Producing the composition of matter in the form of a single crystal will be rather difficult to achieve, due to the fact that it is essentially a quaternary alloy, or solid solution, constituted by four elements of widely differing atomic masses, atomic volumes, valences and electronegativities, and the consequent adverse effect of the limited solubilities that the resulting four individual intermetallic compounds, magnesium silicide, magnesium plumbide, barium silicide and barium plumbide, may have in each other, on the possibility of obtaining such a single crystal. Use of the Bridgman crystal growing technique, for example, may at best lead to a polycrystalline material, composed of a number of large grains. In all likelihood, it looks like that the best way to obtain the composition of matter, in the form of a single crystal, is to use the heat exchanger method, known as HEM, and described earlier in this specification.

Preparing the composition of matter by a melt metallurgy method must be carried out in an inert gas atmosphere, preferably argon, in order to completely avoid, or eliminate, exposure to atmospheric oxygen. The argon gas pressure must be maintained preferably between 2 and 30 physical atmospheres, in order to suppress, or prevent, the loss of magnesium, due to it high volatility, and the consequent deviation from stoichiometry of the resulting material. Moreover, preparing the composition of matter by a powder metallurgy technique is preferably done in such a way that exposure to air or atmospheric oxygen, is entirely avoided, or eliminated. Thus the powder metallurgy preparation process is preferably implemented in an inert gas environment, preferably argon. Furthermore, the long term operation of the composition of matter, when used to constitute the legs, branches or thermoelements of devices for direct thermoelectric energy conversion, regardless of the production method, whether powder- or melt-metallurgical, again requires that exposure to atmospheric oxygen be entirely eliminated. Thus, operation under an absolute vacuum would be strongly recommended as a first choice, or minimum requirement.

We are dealing with a composition of matter that is highly vulnerable, or prone, to oxidation, when exposed to atmospheric air. This is substantiated by the fact that particularly two of the constituents of the composition of matter, namely magnesium and barium, have an enormous affinity for oxygen, owing to the large electronegativity differences between these and oxygen. Of course, the higher the operating temperature, the stronger the aforementioned vulnerability of the composition of matter to oxidation becomes. Operation in an environment of argon gas, maintained at a certain pressure, say a few physical atmospheres, may be required, in order to prevent oxidation, as well as suppress any eventual loss of magnesium that may occur, due to gradual sublimation, especially when the composition of matter is subjected to high operating temperatures. If the foregoing two choices are not feasible in practice, then encapsulation of the thermoelements, branches or legs must be implemented, in order to prevent those thermoelements from coming into direct contact with atmospheric air or oxygen, as well as to suppress any possible gradual loss of magnesium, due to sublimation. The details of this encapsulation have been explained earlier in this specification. This could probably be the best alternative or option.

Generally speaking, the following measures are needed to improve the performance and lead to a more efficient and accelerated industrial production of devices for direct thermoelectric energy conversion, comprising the composition of matter:

(1) Use of the thin film and integrated circuit technologies, as well as encapsulation, in the fabrication of the new devices. Operation of these devices in an environment of absolute vacuum and/or argon gas, subjected to a relative pressure of 2 to 5 physical atmospheres, are still viable alternatives to encapsulation, should the latter prove impractical, or difficult to implement. Moreover, use of surface treatments, such as coating, spraying or painting, is entirely ruled out. The additional coating material, applied to the surface, will most likely diffuse, on the long run, inside the legs, branches or thermoelements, of the thermoelectric devices, especially if these devices are operating at relatively high temperatures. Such a diffusion may bring about unwanted doping, which could lead to a deterioration of the thermophysical properties and, very likely, also the thermoelectric performance of the aforementioned devices. Thus, the only three operating options are: absolute vacuum, an argon gas atmosphere maintained at a certain pressure, say preferably from 2 to 5 physical atmospheres, or encapsulation.

(2) Use of the FGM, or functionally graded material, technique in the manufacture of the new devices. This technique is based on the concept that the free electron concentration throughout the entire thermoelement, or branch, of a thermoelectric device, from the hot junction temperature, $T_h$, to the cold junction temperature, $T_c$, should be so adjusted that the electrical conductivity, $\sigma$, at the temperatures prevailing in the various portions of the thermoelement, or branch, remains constant. In semiconductors, the electrical conductivity normally increases with decreasing temperature. Therefore, to satisfy the requirement of constant electrical conductivity, it is necessary to make the thermoelements, or branches, with a variable impurity content, or doping level, or construct them from several parts, each part with a constant, but different, impurity content. In the low temperature zone, the impurity content, or doping level, should be lower than in the high temperature zone. By doing this, we end up also maintaining the thermoelectric power, S, constant. Consequently, the thermoelectric power factor, $S^2\sigma$, will also remain nearly constant. Furthermore, since the total thermal conductivity will not undergo any considerable variation with temperature, between the hot and cold junctions, the thermoelectric figure of merit, Z, will likewise remain substantially constant, between the hot and cold junctions. And that is what the FGM method is all about: We must maintain a constant figure of merit, Z, throughout the entire thermoelement, or branch, in order to maximize the overall performance of thermoelectric energy conversion devices, in general. To understand this better, it is noted that the thermoelectric power, S, at a given effective mass m*, is governed by the ratio: $T^{3/2}/n$. This can be inferred from the following equation for the Seebeck coefficient, which is well known in the art:

$$S = \frac{k}{q}\left[(r+2) + \ln\frac{2}{n}\left(\frac{2\pi m^* kT}{h^2}\right)^{\frac{3}{2}}\right]$$

where m* is the effective mass of the charge carriers, n the concentration of the charge carriers, T the absolute temperature, q the electronic charge, k the Boltzmann constant, h the Planck constant and r is a constant which depends on the type of scattering which the carrier experiences, as it moves through the material, r=0 for a perfect covalent lattice, while r=2, in the presence of impurities. It is clear from the equation that the thermoelectric power can be improved, or increased, by substituting impurities into the lattice or, to a lesser extent, by choosing substances with a large effective mass. On the other hand, increasing the numbers of charge carriers, results in a decrease in the thermoelectric power, while the opposite is true with the temperature, increasing the temperature, leads to an increase in the thermoelectric power. It is for this reason that metals (n=$10^{22}$ carriers per cm$^3$) have a much poorer thermoelectric power than semiconductors (n=$10^{18}$ to $10^{19}$ carriers per cm$^3$).

The FGM technique is fundamentally based on maintaining the electrical conductivity, σ, constant throughout the thermoelements, branches or legs of a thermoelectric device, from the hot junction to the cold junction. Thus, the electrical conductivity is the only thermoelectric property that is actually controlled to remain constant, by varying the electron concentration, impurity content, or doping level, from a lower value at the cold temperature zone to a higher value at the hot temperature zone. As a consequence of that, the thermoelectric power, which would otherwise have drastically increased, from the cold junction, to the hot junction, will undergo a much lesser variation or change. This also applies to the thermoelectric power factor and the thermoelectric figure of merit. Thus, there is no assurance that the aforementioned two parameters, namely PF and Z, will be maintained exactly constant throughout the thermoelements, branches or legs. This is mainly due to the fact that both the electrical conductivity and the thermoelectric power obey different physical laws, in relation to their dependence on the charge carrier, or impurity, concentration, as well as the temperature.

The basic concepts in this regard are as follows: As temperature goes up, the thermoelectric power goes up, and the electrical conductivity goes down. Conversely, as the temperature decreases, the thermoelectric power decreases, and the electrical conductivity increases. Therefore, as control is exercised over the electrical conductivity, to prevent it from decreasing from the cold zone to the hot zone of a thermoelement, the same is happening regarding the thermoelectric power, which, however, due to the different physical laws it is governed by, will end up behaving as follows:

$$S = 172\left(1 + \frac{k_{el}}{k_{ph}}\right)\mu V K^{-1}$$

where $k_{el}$ and $k_{ph}$ are the electronic and phonon components of the total thermal conductivity. Thus, regardless of the fact that the electrical conductivity is kept constant, as required by the FGM technique, the thermoelectric power, the thermoelectric power factor and the thermoelectric figure of merit will actually still undergo a certain variation, although a much lesser one, than would otherwise have been the case. Maintaining a constant power factor and a constant figure of merit, throughout the branches, legs or thermoelements of a thermoelectric device represents an ideal situation that would, undoubtedly, lead to maximizing the benefit from the FGM method. Nonetheless, the method, or technique, certainly leads to a definite improvement in the performance of thermoelectric energy conversion devices. Its use is, therefore, highly recommended.

(3) Use of the HEM, in preference to the traditional Bridgman or other crystal growing techniques, in the production of single crystals of the composition of matter, if necessary.

(4) Use of the powder metallurgy technique, in preference to conventional melt metallurgical, or casting, methods, in the production of the composition of matter.

(5) Avoiding all kinds of exposure of the composition of matter to atmospheric oxygen, whether during production thereof, by any method whatsoever, or during its long term operation, as a thermoelectric energy conversion material.

(6) Avoiding all kinds of unwanted doping or contamination with foreign impurities, during preparation, or production, of the composition of matter, by any technique whatsoever.

(7) Avoiding any deviation from stoichiometry, mainly brought about by the loss of magnesium due to evaporation or sublimation whether during production, or during the long term operation of the composition of matter.

(8) Producing the powders needed by the powder metallurgy technique, if implemented, using the new technique comprising synthesizing precursors to alloys having the general composition of matter Ba—Mg—Si—Pb, by aqueous coprecipitation and metal-organo complex methods, and then hydrogen reduction of the precursors to produce alloys in fine-powder poly-crystalline form. Thus the need to use a planetary ball mill, to manufacture the necessary powders, as well as the consequent contamination with iron, will be avoided.

(9) Should the foregoing technique not prove feasible for producing the powders required to carry out the powder metallurgy method, then the powders should be preferably prepared using the gas atomization method, which is well known in the art of powder metallurgy. Gas atomization is generally less expensive than the rotating electrode process, REP, and produces spherical particles of about 100 microns in diameter, which size is smaller than that produced by the plasma rotating electrode process, PREP, as well as water atomization. Furthermore, oxide contamination is about 120 ppm, which is almost negligible. Thus, gas atomization produces particles that have good packing and flow characteristics, and exhibit apparent and tap densities in the 60 to 65% of the theoretical range. Therefore, gas atomization is the best alternative to the precursor synthesis method described in item (8) above.

According to another embodiment or aspect of this invention, a process for producing a device for direct thermoelectric energy conversion, consisting of a p-type branch or thermoelement, an n-type branch or thermoelement, a hot junction and a cold junction, comprises the use of a composition of matter in the manufacture of one, or both, of the branches of the device, wherein the composition of matter, in its most complete form, consists of magnesium silicide, $Mg_2Si$, wherein part of magnesium is replaced by one, or more, elements, selected from the group comprising sodium, potassium, rubidium, cesium, beryllium, calcium, strontium and barium, and wherein part of silicon is replaced by one, or more, elements, selected from the group comprising boron, germanium, tin, lead, nitrogen, phosphorus, arsenic, antimony, bismuth, oxygen, sulfur, selenium, tellurium, chlorine, bromine and iodine, wherein the composition of matter has the following constitutional formula:

$$Na_{2q}K_{2t}Rb_{2u}Cs_{2v}Be_{2w}Ca_{2x}Sr_{2y}Ba_{2z}Mg_{2(1-r)}Si_{1-s}$$
$$B_aGe_bSn_cPb_dN_eP_fAs_gSb_hBi_iO_jS_kSe_lTe_mCl_nBr_oI_p$$

wherein r=q+t+u+v+w+x+y+z represents the sum of the atomic proportions of the elements that replace part of magnesium, and wherein s=a+b+c+d+e+f+g+h+i+j+k+l+m+n+o+p represents the sum of the atomic proportions of the elements that replace part of silicon, wherein r varies from 0.1 to 0.4, wherein (q+t+u+v+w+x+y) varies from $10^{-8}$ to $10^{-1}$, wherein each of q, t, u, v, w, x and y varies from 0 to 0.1, wherein z is not less than 0.1, wherein s=a+b+c+d+e+f+g+h+i+j+k+l+m+n+o+p varies from 0.1 to 0.3, wherein (a+b+c+e+f+g+h+i+j+k+l+m+n+o+p) varies from $10^{-8}$ to $10^{-1}$, wherein each of a, b, c, e, f, g, h, i, j, k, l, m, n, o and p varies from 0 to 0.1, and wherein d is not less than 0.1. The aforementioned constitutional formula defines the entire spectrum of p-type and n-type doping, specifically, when the doping element, or elements, is/are introduced as compounds with one, or more, of the basic constituents: Mg, Si, Pb and Ba. The type of electrical conductivity to be eventually brought about, using the broad-spectrum constitutional formula, whether p-type or n-type, is determined on the basis of the relative proportions of the doping elements to the left of Mg and to the right of Si. This, obviously, excludes both Ba and Pb, since they are basic constituents of the composition of matter. As such, they cannot be regarded as doping elements or agents. We should, once more, end up with a free charge carrier concentration preferably in the range from $1 \times 10^{15}$ to $5 \times 10^{20}$ carriers per $cm^3$ in order to optimize the thermoelectric performance. This is applicable to all other constitutional formulas in the present specification. In this embodiment, the free charge carrier concentration range is again achieved by adjusting the relative atomic proportions of the elements that replace part of magnesium, except barium, and those that replace part of silicon, except lead.

In the preceding embodiment of this invention, as well as throughout this specification, it is stated that the atomic proportions of each of barium and lead cannot be lower than 0.1, or 10%, regardless of how many elements are introduced to replace part of magnesium and/or part of silicon in the composition of matter. This is deliberately done in order to ensure that the thermal conductivity of the composition of matter will stay close to the absolute minimum. As a matter of fact, such a minimum thermal conductivity can be achieved, if the atomic proportion of barium is, approximately, in the range from 20% to 25%, and that of lead is, approximately, in the range from 15% to 20%. Furthermore, due to the fact that the thermal conductivity, particularly the lattice component thereof, will start dropping very quickly, upon the introduction of only a very small atomic percentage of each of barium and lead, the aforementioned minimum atomic proportion of each of the two elements, namely 10%, will ensure that the thermal conductivity of the composition of matter will not deviate much from the absolute minimum.

In all constitutional formulas in this specification, no matter how extensive or sophisticated, the atomic proportion of each and every element, other than Mg, Si, Pb and Ba, is allowed to become zero, as a limiting case. This eventually leads to the convergence thereof to the following formula:

$$Ba_{2r}Mg_{2(1-r)}Si_{1-x}Pb_x$$

which, as mentioned earlier, represents the cornerstone of this invention.

According to another embodiment or aspect of this invention, a process for producing a device for direct thermoelectric energy conversion, consisting of a p-type branch or thermoelement, an n-type branch or thermoelement, a hot junction and a cold junction, comprises the use of a composition of matter in the manufacture of the n-type branch, and/or p-type branch, of the device, wherein the composition of matter comprises magnesium, Mg, silicon, Si, lead, Pb, and barium, Ba, and optionally comprises one, or more, additional doping materials.

According to another embodiment or aspect of this invention, a process for producing a device for direct thermoelectric energy conversion, consisting of a p-type branch or thermoelement, an n-type branch or thermoelement, a hot junction and a cold junction, comprises the use of a composition of matter in the manufacture of the n-type branch, and/or p-type branch, of the device, wherein the composition of matter comprises magnesium, Mg, silicon, Si, lead, Pb, and barium, Ba.

According to another embodiment or aspect of this invention, the atomic proportion of barium relative to the maximum atomic stoichiometric proportion of magnesium, in the absence of barium, varies from 0.1 to 0.4, and the atomic proportion of lead relative to the maximum atomic stoichiometric proportion of silicon, in the absence of lead, varies from 0.1 to 0.3, in relation to the preceding embodiment.

According to another embodiment or aspect of this invention, in relation to the first of the preceding three embodiments, the atomic proportion of barium relative to the maximum atomic stoichiometric proportion of magnesium, in the absence of barium, varies from 0.1 to 0.4, and the atomic proportion of lead, relative to the maximum atomic stoichiometric proportion of silicon, in the absence of lead, varies from 0.1 to 0.3, wherein the atomic, or molecular, proportion of the doping material, or materials, in the composition of matter, varies from $10^{-8}$ to $10^{-1}$, and wherein the free charge carrier concentration varies from $1 \times 10^{15}$ to $5 \times 10^{20}$ carriers per $cm^3$.

According to another embodiment or aspect of this invention, as defined in the preceding embodiment, the additional doping material, or materials, for the n-type branch of the device, comprise one, or more, elements, selected from the group consisting of nitrogen, phosphorus, arsenic, antimony, bismuth, oxygen, sulfur, selenium, tellurium, chlorine, bromine, iodine, magnesium, barium, lithium, gold, aluminum, indium, iron and/or compounds thereof.

According to another embodiment or aspect of this invention, as defined in the first of the preceding two embodiments, the additional doping material, or materials, for the p-type branch of the device, comprise one, or more, elements, selected from the group consisting of copper, silver, sodium, potassium, rubidium, cesium, boron, silicon, lead and/or compounds thereof.

Various modifications may be made to the embodiment herein chosen for purposes of disclosure without departing from the spirit and scope of the invention as encompassed by the appended claims.

I claim:

1. A process for producing a device for direct thermoelectric energy conversion, consisting of a p-type branch or thermoelectric, an n-type branch or thermoelement, a hot junction and a cold junction, comprising preparing the n-type branch or thermoelement and/or the p-type branch or thermoelement of the said device with a composition of matter comprising magnesium, silicon, lead and barium, wherein the atomic proportion of barium relative to the maximum atomic stoichiometric proportion of magnesium in the absence of barium varies from 0.1 to 0.4, and wherein the atomic proportion of lead relative to the maximum atomic stoichiometric proportion of silicon in the absence of lead varies from 0.1 to 0.3.

2. A process for producing a device for direct thermoelectric energy conversion, consisting of a p-type branch or thermoelement, an n-type branch or thermoelement, a hot junction and a cold junction, comprising preparing the n-type branch or thermoelement and/or the p-type branch or thermoelement of the said device with a composition of matter comprising magnesium, silicon, lead and barium, wherein the composition of matter includes one or more additional doping materials, wherein the atomic proportion of barium relative to the maximum atomic stoichiometric proportion of magnesium in the absence of barium varies from 0.1 to 0.4, wherein the atomic proportion of lead relative to the maximum atomic stoichiometric proportion of silicon in the absence of lead varies from 0.1 to 0.3, wherein the atomic or molecular proportion of the doping material or materials in the said composition of matter varies from $10^{-8}$ to $10^{-1}$ and wherein the free charge carrier concentration varies from $1 \times 10^{15}$ to $5 \times 10^{20}$ carriers per cm$^3$.

3. A process as defined in claim 2, wherein said additional doping material or materials for the n-type branch or thermoelement of the said device comprises one or more elements selected from the group consisting of nitrogen, phosphorus, arsenic, antimony, bismuth, oxygen, sulfur, selenium, tellurium, chlorine, bromine, iodine, magnesium, barium, lithium, gold, aluminum, indium, iron and compounds thereof.

4. A process as defined in claim 2, wherein said additional doping material or materials for the p-type branch or thermoelement of the said device comprise one or more elements selected from the group consisting of copper, silver, sodium, potassium, rubidium, cesium, boron, silicon, lead and compounds thereof.

5. A process for producing a device for direct thermoelectric energy conversion, consisting of a p-type branch or thermoelement, an n-type branch or thermoelement, a hot junction and a cold junction, comprising preparing the n-type branch or thermoelement and/or the p-type branch or thermoelement of the said device with a composition of matter comprising magnesium suicide, Mg$_2$Si, wherein part of magnesium is replaced by barium and part of silicon is replaced by lead, wherein said composition of matter thus is an alloy or solid solution of intermetallic compounds containing magnesium silicide, magnesium plumbide, barium silicide and barium plumbide, wherein said composition of matter has the following constitutional formula:

$$Ba_{2r}Mg_{2(1-r)}Si_{1-x}Pb_x,$$

wherein r, (1−r), (1−x) and x represent the atomic proportion of each of barium, magnesium, silicon and lead in the composition of matter, respectively, and wherein said composition of matter optionally contains one or more additional doping materials.

6. A process for producing a device for direct thermoelectric energy conversion, consisting of a p-type branch or thermoelement, an n-type branch or thermoelement, a hot junction and a cold junction, comprising preparing the n-type branch or thermoelement and/or the p-type branch or thermoelement of the said device with a composition of matter comprising magnesium silicide, Mg$_2$Si, wherein part of magnesium is replaced by barium and part of silicon is replaced by lead, wherein said composition of matter thus is an alloy or solid solution of intermetallic compounds containing magnesium silicide, magnesium plumbide, barium silicide and barium plumbide and wherein said composition of matter has the following constitutional formula:

$$Ba_{2r}Mg_{2(1-r)}Si_{1-x}Pb_x$$

wherein r, (1−r), (1−x) and x represent the atomic proportion of each of barium, magnesium, silicon and lead in the composition of matter, respectively.

7. A process as defined in claim 6, wherein r varies from 0.1 to 0.4, (1−r) varies from 0.6 to 0.9, x varies from 0.1 to 0.3 and (1−x) varies from 0.7 to 0.9.

8. A process as defined in claim 5, wherein r varies from 0.1 to 0.4, (1−r) varies from 0.6 to 0.9, x varies from 0.1 to 0.3 and (1−x) varies from 0.7 to 0.9, wherein the atomic or molecular proportion of the doping material or materials in the said composition of matter varies from $10^{-8}$ to $10^{-1}$ and wherein the free charge carrier concentration varies from $1 \times 10^{15}$ to $5 \times 10^{20}$ carriers cm$^3$.

9. A process as defined in claim 8, wherein said additional doping material or materials for the n-type branch or thermoelement of the said device comprise one or more elements selected from the group consisting of nitrogen, phosphorus, arsenic, antimony, bismuth, oxygen, sulfur, selenium, tellurium, chlorine, bromine, iodine, magnesium, barium, lithium, gold, aluminum, indium, iron and compounds thereof.

10. A process as defined in claim 8, wherein said additional doping material or materials for the p-type branch or thermoelement of the said device comprise one or more elements selected from the group consisting of copper, silver, sodium, potassium, rubidium, cesium, boron, silicon, lead and compounds thereof.

11. A process for producing a device for direct thermoelectric energy conversion, consisting of a p-type branch or thermoelement, an n-type branch or thermoelement, a hot junction and a cold junction, comprising preparing the n-type branch or thermoelement and/or the p-type branch or thermoelement of the said device with a composition of matter comprising magnesium silicide, Mg$_2$Si, wherein part of magnesium is replaced by one or more elements selected from the group consisting of beryllium, calcium, strontium and barium, and wherein part of silicon is replaced by one or more elements selected from the group consisting of germanium, tin, lead, antimony, bismuth, selenium and tellurium, wherein said composition of matter has the following constitutional formula:

$$Be_{2u}Ca_{2v}Sr_{2w}Ba_{2z}Mg_{2(1-r)}Si_{1-s}Ge_aSn_bPb_cSb_d\text{-}Bi_eSe_fTe_g$$

wherein r=u+v+w+z represents the sum of the atomic proportions of the elements that replace part of magnesium, wherein s=a+b+c+d+e+f+g represents the sum of the atomic proportions of the elements that replace part of silicon and wherein said composition of matter optionally contains one or more additional doping materials.

12. A process for producing a device for direct thermoelectric energy conversion, consisting of a p-type branch or thermoelement, an n-type branch or thermoelement, a hot junction and a cold junction, comprising preparing the n-type branch or thermoelement and/or the p-type branch or thermoelement of the said device with a composition of matter comprising magnesium silicide, $Mg_2Si$, wherein part of magnesium is replaced by one or more elements selected from the group consisting of beryllium, calcium, strontium and barium, and wherein part of silicon is replaced by one or more elements selected from the group consisting of germanium, tin, lead, antimony, bismuth, selenium and tellurium, and wherein said composition of matter has the following constitutional formula:

$$Be_{2u}Ca_{2v}Sr_{2w}Ba_{2z}Mg_{2(1-r)}Si_{1-s}Ge_aSn_bPb_cSb_dBi_eSe_fTe_g$$

wherein $r=u+v+w+z$ represents the sum of the atomic proportions of the elements that replace part of magnesium and wherein $s=a+b+c+d+e+f+g$ represents the sum of the atomic proportions of the elements that replace part of silicon.

13. A process as defined in claim 12, wherein r varies from 0.1 to 0.4, (1−r) varies from 0.6 to 0.9, each of u, v and w varies from 0 to 0.3, (u+v+w) varies from 0 to 0.3, z is not less than 0.1, s varies from 0.1 to 0.3, (1−s) varies from 0.7 to 0.9, each of a, b, d, e, f and g varies from 0 to 0.2, (a+b+d+e+f+g) varies from 0 to 0.2, and c is not less than 0.1.

14. A process as defined in claim 11, wherein r varies from 0.1 to 0.4, (1−r) varies from 0.6 to 0.9, each of u, v and w varies from 0 to 0.3, (u+v+w) varies from 0 to 0.3, z is not less than 0.1, s varies from 0.1 to 0.3, (1−s) varies from 0.7 to 0.9, each of a, b, d, e, f and g varies from 0 to 0.2, (a+b+d+e+f+g) varies from 0 to 0.2, and c is not less than 0.1, wherein the atomic, or molecular, proportion of the doping material, or materials, in the said composition of matter varies from $10^{-8}$ to $10^{-1}$ and wherein the free charge carrier concentration varies from $1\times10^{15}$ to $5\times10^{20}$ carriers per $cm^3$.

15. A process as defined in claim 14, wherein said additional doping material, or materials, for the n-type branch or thermoelement of the said device, comprise one or more elements selected from the group consisting of nitrogen, phosphorus, arsenic, antimony, bismuth, oxygen, sulfur, selenium, tellurium, chlorine, bromine, iodine, magnesium, barium, lithium, gold, aluminum, indium, iron and compounds thereof.

16. A process as defined in claim 14, wherein said additional doping material, or materials, for the p-type branch or thermoelement of the said device, comprise one or more elements selected from the group consisting of copper, silver, sodium, potassium, rubidium, cesium, boron, silicon, lead and compounds thereof.

17. A process for producing a device for direct thermoelectric enemy conversion, consisting of a p-type branch or thermoelement, an n-type branch or thermoelement, a hot junction and a cold junction, comprising preparing the n-type branch or thermoelement and/or the p-type branch or thermoelement of the said device with a composition of matter comprising magnesium, silicon, lead and barium, wherein the composition of matter includes one or more additional doping materials, wherein said additional doping material, or materials, for the p-type branch or thermoelement of the said device, are selected from the group consisting of sodium, potassium, rubidium and cesium, wherein said doping materials are chemically reacted to form compounds with silicon and/or lead, prior to their introduction into the host material, wherein said composition of matter has the following constitutional formula:

$$Na_{2u}K_{2v}Rb_{2w}Cs_{2y}Ba_{2z}Mg_{2(1-r)}Si_{1-x}Pb_x$$

wherein $r=u+v+w+y+z$ represents the sum of the atomic proportions of the elements that replace part of magnesium, wherein r varies from 0.1 to 0.4, wherein (u+v+w+y) varies from $10^{-8}$ to $10^{-1}$, wherein each of u, v, w and y varies from 0 to 0.1, wherein z is not less than 0.1, wherein x varies from 0.1 to 0.3 and wherein the free charge carrier concentration varies from $1\times10^{15}$ to $5\times10^{20}$ carriers per $cm^3$.

18. A process for producing a device for direct thermoelectric energy conversion, consisting of a p-type branch or thermoelement, an n-type branch or thermoelement, a hot junction and a cold junction, comprising preparing the n-type branch or thermoelement and/or the p-type branch or thermoelement of the said device with a composition of matter comprising magnesium, silicon, lead and barium, wherein the composition of matter includes one or more additional doping materials, wherein said additional doping material or materials for the n-type branch or thermoelement of the said device are selected from the group consisting of phosphorus, arsenic, antimony, bismuth, sulfur, selenium, tellurium, bromine and iodine, wherein said doping materials are chemically reacted to form compounds with magnesium and/or barium prior to their introduction into the host material, wherein said composition of matter has the following constitutional formula:

$$Ba_{2r}Mg_{2(1-r)}Si_{1-s}Pb_aP_bAs_cSb_dBi_eS_fSe_gTe_hBr_iI_j$$

wherein $s=a+b+c+d+e+f+g+h+i+j$ represents the sum of the atomic proportions of the elements that replace part of silicon, wherein s varies from 0.1 to 0.3, wherein (b+c+d+e+f+g+h+i+j) varies from $10^{-8}$ to $10^{-1}$, wherein each of b, c, d, e, f, g, h, i and j varies from 0 to 0.1, wherein a is not less than 0.1, wherein r varies from 0.1 to 0.4, and wherein the free charge carrier concentration varies from $1\times10^{15}$ to $5\times10^{20}$ carriers per $cm^3$.

19. A process for producing a device for direct thermoelectric energy conversion, consisting of a p-type branch or thermoelement, an n-type branch or thermoelement, a hot junction and a cold junction, comprising preparing the n-type branch or thermoelement and/or the p-type branch or thermoelement of the said device with a composition of matter comprising magnesium, silicon, lead and barium, wherein the composition of matter includes one or more additional doping materials, wherein said one or more additional doping material, or materials, required for the n-type, and p-type, branches or thermoelements of the said device, are combined together so as to bring about a composition of matter having the following constitutional formula:

$$Na_{2u}K_{2v}Rb_{2w}Cs_{2y}Ba_{2z}Mg_{2(1-r)Si1-s}Pb_aP_bAS_cSb_dBi_eS_fSe_gTe_hBr_iI_j$$

wherein said additional doping material, or materials, comprise one or more elements selected from the group consisting of Na, K, Rb and Cs, and one or more elements selected from the group consisting of P, As, Sb, Bi, S, Se, Te, Br and I, wherein the subscripts represent the atomic proportions of the relevant elements, wherein $r=u+v+w+y+z$ varies from 0.1 to 0.4, wherein (u+v+w+y) varies from $10^{-8}$ to $10^{-1}$, wherein each of u, v, w and y varies from 0.1 to 0.1, wherein z is not less than 0.1, wherein $s=a+b+c+d+e+f+g+h+i+j$ varies from 0.1 to 0.3, wherein (b+c+d+e+f+g+h+i+j) varies from $10^{-8}$ to $10^{-1}$, wherein each of b, c, d, e, f g, h, i and j varies from 0 to 0.1, wherein a is not less than 0.1, wherein the type of electrical conductivity eventually obtained, whether p-type or n-type, is determined by the relative atomic proportions of the elements to the left of barium, and those to the right of lead, in the said constitutional formula, wherein said additional doping material or materials are introduced as compounds with one or more of the basic constituents: Mg, Ba, Si and Pb, into the composition of matter, and wherein the free charge carrier concentration varies from $1\times10^{15}$ to $5\times10^{20}$ carriers per $cm^3$.

* * * * *

UNITED STATES PATENT AND TRADEMARK OFFICE
CERTIFICATE OF CORRECTION

| | | |
|---|---|---|
| PATENT NO. | : 7,166,796 B2 | Page 1 of 1 |
| APPLICATION NO. | : 10/235230 | |
| DATED | : January 23, 2007 | |
| INVENTOR(S) | : Michael Nicolaou | |

It is certified that error appears in the above-identified patent and that said Letters Patent is hereby corrected as shown below:

Title Page the Inventor's last name should read as follows:

item (12)
   Nicolaou

Title Page the Inventor's last name should read as follows:

item (76) Inventor:  Michael Nicolaou, 661 Washington St., Suite 304, Norwood, MA (US) 02062-3529

In column 36, at line 46 the formula should read as follows:

$Ba_{2r}Mg_{2(1-r)}Si_{1-x}Pb_x$

In column 37, at line the formula should read as follows:

$Ba_{2r}Mg_{2(1-r)}Si_{1-x}Pb_x$

In column 54, claim 19, at lines 53-54 the formula should read as follows:

$Na_{2u}K_vRb_{2w}Cs_{2y}Ba_{2z}Mg_{2(1-r)}Si_{1-s}Pb_aP_bAs_cSb_dBi_eS_fSe_gTe_hBr_iI_j$

Signed and Sealed this

Twenty-fourth Day of April, 2007

JON W. DUDAS
*Director of the United States Patent and Trademark Office*

UNITED STATES PATENT AND TRADEMARK OFFICE
CERTIFICATE OF CORRECTION

PATENT NO. : 7,166,796 B2  
APPLICATION NO. : 10/235230  
DATED : January 23, 2007  
INVENTOR(S) : Michael C. Nicolaou It is certified that error appears in the above-identified patent and that said Letters Patent is hereby corrected as shown below:

In the masthead the Inventor's name should read as follows:

(76) Inventor: Michael C. Nicolaou, 661 Washington St., Suite 304, Norwood, MA (US) 02062-3529

In column 13, at lines 12-13 the formula should read as follows:

$$(Be, Ca, Sr, Ba)_{2r}Mg_{2(1-r)}Si_{1-s}(Ge, Sn, Pb, Sb, Bi, Se, Te)_s$$

In column 14, line 66 the formula should read as follows:

$$Be_{2u}Ca_{2v}Sr_{2w}Ba_{2z}Mg_{2(1-r)}Si_{1-s}Ge_aSn_bPb_cSb_dBi_eSe_fTe_g$$

In column 17, line 10 the formula should read as follows:

$$Ba_{2r}Mg_{2(1-r)})Si_{1-x}Pb_x$$

In column 23, line 20 of the formula should read as follows:

$$Be_{2u}Ca_{2v}Sr_{2w}Ba_{2z}Mg_{2(1-r)}Si_{1-s}Ge_aSn_bPb_cSb_dBi_eSe_fTe_g$$

In column 24, lines 18-19 the formula should read as follows:

$$Be_{2u}Ca_{2v}Sr_{2w}Ba_{2z}Mg_{2(1-r)}Si_{1-s}Ge_aSn_bPb_cSb_dBi_eSe_fTe_g$$

In column 28, lines 5-8 should read as follows:

Consequently, the optimum doping level, that is the one that maximizes the thermoelectric figure of merit, lies in the range from $10^{19}$ to $10^{20}$ carriers per cm$^3$.

UNITED STATES PATENT AND TRADEMARK OFFICE
CERTIFICATE OF CORRECTION

PATENT NO. : 7,166,796 B2
APPLICATION NO. : 10/235230
DATED : January 23, 2007
INVENTOR(S) : Michael C. Nicolaou It is certified that error appears in the above-identified patent and that said Letters Patent is hereby corrected as shown below:

In column 28, line 36-52 should read as follows:

When point defects scatter phonons, mainly in virtue of their mass difference, Professor Klemens derived the following equation for the resulting change in the lattice thermal conductivity:

$$k = \frac{K}{2\pi^2 \upsilon} \frac{\omega_0}{B} \tan^{-1} \frac{\omega_D}{\omega_o} = k_o \frac{\omega_o}{\omega_D} \tan^{-1} \frac{\omega_D}{\omega_o}$$

where k is the lattice thermal conductivity due to point defect scattering, $\omega_o$ is the phonon vibration angular frequency at which the mean free path for point defect scattering equals that for intrinsic scattering, $\omega_D$ is the phonon vibration Debye frequency = k $_D$/h, K is the Boltzmann constant and Λ is the velocity of sound, or phonon velocity.

In column 29, line 51 should read as follows:

$f_i^A$ = relative proportion of each atom on a particular site A

In column 35, lines 57-64 should read as follows:

The above criteria were further elaborated by Pierre Aigrain, who eventually put them in the following definitive, more practical, form: Good thermoelectric engines (power generating devices), for close to room temperature cold source (junction) operation, should make use of materials having the following properties:

(1) Operating hot source (junction) temperature around 700-800°C.

In column 36, lines 21-23 should read as follows:

Full advantage of any anisotropy should be taken, if the composition of matter is produced as a single crystal.

UNITED STATES PATENT AND TRADEMARK OFFICE
CERTIFICATE OF CORRECTION

| | | |
|---|---|---|
| PATENT NO. | : 7,166,796 B2 | |
| APPLICATION NO. | : 10/235230 | |
| DATED | : January 23, 2007 | |
| INVENTOR(S) | : Michael C. Nicolaou | |

It is certified that error appears in the above-identified patent and that said Letters Patent is hereby corrected as shown below:

In column 39, lines 62-66 should read as follows:

This figure for the energy conversion efficiency will be more accurately calculated, if we substitute the average temperature between the hot and cold junctions, that is 550K, instead of 800K, in the foregoing equation.

In column 40, lines 29-35 should read as follows:

Since the alloy, or solid solution, contains substantial atomic proportions of both magnesium and silicon, in the stoichiometric ratio of 2:1, the composition of matter may be considered essentially consisting of magnesium silicide, $Mg_2Si$, wherein part of magnesium is replaced by barium, and part of silicon is replaced by lead.

In column 42, lines 45-51 should read as follows:

Consequently, doping with one, or more, of the elements Na, K, Rb and/or Cs, either in their pure elemental forms, or as compounds with another element or elements, preferably with Si and/or Pb, as indicated above, will ensure a much more powerful and effective p-type doping, than any of the elements belonging to the groups from IIIA to IIIB in the periodic table of the elements.

In column 45, lines 8-11 should read as follows:

The data may be safely extended, however, to the composition of matter, herein described, since it is substantially composed of magnesium silicide.

Claim 1 should read as follows:

1. A process for producing a device for direct thermoelectric energy conversion, consisting of a p-type branch or thermoelement, an n-type branch or thermoelement, a hot junction and a cold junction, comprising preparing the n-type branch or thermoelement and/or the p-type branch or thermoelement of the said device with a composition of matter comprising magnesium, silicon, lead and barium, wherein the atomic proportion of barium relative to the maximum atomic stoichiometric proportion of magnesium in the absence of barium varies from 0.1 to 0.4, and wherein the atomic proportion of lead relative to the maximum atomic stoichiometric proportion of silicon in the absence of lead varies from 0.1 to 0.3.

UNITED STATES PATENT AND TRADEMARK OFFICE
CERTIFICATE OF CORRECTION

PATENT NO. : 7,166,796 B2
APPLICATION NO. : 10/235230
DATED : January 23, 2007
INVENTOR(S) : Michael C. Nicolaou It is certified that error appears in the above-identified patent and that said Letters Patent is hereby corrected as shown below:

Claim 5 should read as follows:

5. A process for producing a device for direct thermoelectric energy conversion, consisting of a p-type branch or thermoelement, an n-type branch or thermoelement, a hot junction and a cold junction, comprising preparing the n-type branch or thermoelement and/ or the p-type branch or thermoelement of the said device with a composition of matter comprising magnesium silicide, $Mg_2Si$, wherein part of magnesium is replaced by barium and part of silicon is replaced by lead, wherein said composition of matter thus is an alloy or solid solution of intermetallic compounds containing magnesium silicide, magnesium plumbide, barium silicide and barium plumbide, wherein said composition of matter has the following constitutional formula:

$$Ba_{2r}Mg_{2(1-r)}Si_{1-x}Pb_x,$$

wherein r, (1-r), (1-x) and x represent the atomic proportion of each of barium, magnesium, silicon and lead in the composition of matter, respectively, and wherein said composition of matter optionally contains one or more additional doping materials.

Claim 8 should read as follows:

10. A process as defined in claim 7, wherein r varies from 0.1 to 0.4, (1-r) varies from 0.6 to 0.9, x varies from 0.1 to 0.3 and (1-x) varies from 0.7 to 0.9, wherein the atomic or molecular proportion of the doping material or materials in the said composition of matter varies from $10^{-8}$ to $10^{-1}$ and wherein the free charge carrier concentration varies from $1 \times 10^{15}$ to $5 \times 10^{20}$ carriers per $cm^{-3}$.

Claim 17 should read as follows:

17. A process for producing a device for direct thermoelectric energy conversion, consisting of a p-type branch or thermoelement, an n-type branch or thermoelement, a hot junction and a cold junction, comprising preparing the n-type branch or thermoelement and/or the p-type branch or thermoelement of the said device with a composition of matter comprising magnesium, silicon, lead and barium, wherein the composition of matter includes one or more additional doping materials, wherein said additional doping material, or materials, for the p-type branch or thermoelement of the said device, are selected from the group consisting of sodium, potassium, rubidium and cesium, wherein said doping materials are chemically reacted to form compounds with silicon and/or lead, prior to their introduction into the host material, wherein said composition of matter has the following constitutional formula:

$$Na_{2u}K_{2v}Rb_{2w}Cs_{2y}Ba_{2z}Mg_{2(1-r)}Si_{1-x}Pb_x$$

UNITED STATES PATENT AND TRADEMARK OFFICE
CERTIFICATE OF CORRECTION

PATENT NO. : 7,166,796 B2
APPLICATION NO. : 10/235230
DATED : January 23, 2007
INVENTOR(S) : Michael C. Nicolaou It is certified that error appears in the above-identified patent and that said Letters Patent is hereby corrected as shown below:

wherein $r = u + v + w + y + z$ represents the sum of the atomic proportions of the elements that replace part of magnesium, wherein r varies from 0.1 to 0.4, wherein $(u + v + w + y)$ varies from $10^{-8}$ to $10^{-1}$, wherein each of u, v, w and y varies from 0 to 0.1, wherein z is not less than 0.1, wherein x varies from 0.1 to 0.3 and wherein the free charge carrier concentration varies from $1 \times 10^{15}$ to $5 \times 10^{20}$ carriers per cm$^3$.

Claim 19 should read as follows:

19. A process for producing a device for direct thermoelectric energy conversion, consisting of a p-type branch or thermoelement, an n-type branch or thermoelement, a hot junction and a cold junction, comprising preparing the n-type branch or thermoelement and/or the p-type branch or thermoelement of the said device with a composition of matter comprising magnesium, silicon, lead and barium, wherein the composition of matter includes one or more additional doping materials, wherein said one or more additional doping material, or materials, required for the n-type, and p-type, branches or thermoelements of the said device, are combined together so as to bring about a composition of matter having the following constitutional formula:

$$Na_{2u}K_{2v}Rb_{2w}Cs_{2y}Ba_{2z}Mg_{2(1-r)}Si_{1-s}Pb_aP_bAs_cSb_dBi_eS_fSe_gTe_hBr_iI_j$$

UNITED STATES PATENT AND TRADEMARK OFFICE
CERTIFICATE OF CORRECTION

PATENT NO. : 7,166,796 B2
APPLICATION NO. : 10/235230
DATED : January 23, 2007
INVENTOR(S) : Michael C. Nicolaou It is certified that error appears in the above-identified patent and that said Letters Patent is hereby corrected as shown below:

wherein said additional doping material, or materials, comprise one or more elements selected from the group consisting of Na, K, Rb and Cs, and one or more elements selected from the group consisting of P, As, Sb, Bi, S, Se, Te, Br and I, wherein the subscripts represent the atomic proportions of the relevant elements, wherein $r = u + v + w + y + z$ varies from 0.1 to 0.4, wherein $(u + v + w + y)$ varies from $10^{-8}$ to $10^{-1}$, wherein each of u, v, w and y varies from 0 to 0.1, wherein z is not less than 0.1, wherein $s = a + b + c + d + e + f + g + h + i + j$ varies from 0.1 to 0.3, wherein $(b + c + d + e + f + g + h + i + j)$ varies from $10^{-8}$ to $10^{-1}$, wherein each of b, c, d, e, f, g, h, i and j varies from 0 to 0.1, wherein a is not less than 0.1, wherein the type of electrical conductivity eventually obtained, whether p-type or n-type, is determined by the relative atomic proportions of the elements to the left of barium, and those to the right of lead, in the said constitutional formula, wherein said additional doping material or materials are introduced as compounds with one or more of the basic constituents: Mg, Ba, Si and Pb, into the composition of matter, and wherein the free charge carrier concentration varies from $1 \times 10^{15}$ to $5 \times 10^{20}$ carriers per $cm^3$.

Signed and Sealed this

Eleventh Day of December, 2007

JON W. DUDAS
*Director of the United States Patent and Trademark Office*